United States Patent
Martinson et al.

(10) Patent No.: US 9,255,323 B2
(45) Date of Patent: Feb. 9, 2016

(54) SPUTTERING TARGET INCLUDING A FEATURE TO REDUCE CHALCOGEN BUILD UP AND ARCING ON A BACKING TUBE

(75) Inventors: Robert Martinson, Palo Alto, CA (US); Heinrich Von Bunau, San Jose, CA (US); Mark Campello, San Jose, CA (US); Ron Rulkens, Milpitas, CA (US); Tom Heckel, Milpitas, CA (US); Johannes Vlcek, San Francisco, CA (US)

(73) Assignee: APOLLO PRECISION FUJIAN LIMITED, Quanzhou (CN)

(*) Notice: Subject to any disclaimer, the term of this patent is extended or adjusted under 35 U.S.C. 154(b) by 140 days.

(21) Appl. No.: 13/525,593

(22) Filed: Jun. 18, 2012

(65) Prior Publication Data
US 2013/0337602 A1 Dec. 19, 2013

(51) Int. Cl.
| | | |
|---|---|---|
| C23C 14/34 | (2006.01) |
| H01J 37/34 | (2006.01) |
| H01L 31/18 | (2006.01) |
| H01L 31/032 | (2006.01) |
| C23C 14/06 | (2006.01) |

(52) U.S. Cl.
CPC ......... C23C 14/3407 (2013.01); C23C 14/0623 (2013.01); H01J 37/3414 (2013.01); H01J 37/3423 (2013.01); H01L 31/0322 (2013.01); H01L 31/18 (2013.01); *Y02E 10/541* (2013.01)

(58) Field of Classification Search
CPC .................................... H01J 37/3414–37/3423
USPC .................................................... 204/298.21
See application file for complete search history.

(56) References Cited

U.S. PATENT DOCUMENTS

| 4,356,073 | A | | 10/1982 | McKelvey | |
|---|---|---|---|---|---|
| 4,478,703 | A | * | 10/1984 | Edamura et al. | 204/298.28 |
| 5,470,452 | A | * | 11/1995 | Dickey et al. | 204/298.21 |
| 5,518,593 | A | * | 5/1996 | Hosokawa et al. | 204/192.12 |
| 5,527,439 | A | * | 6/1996 | Sieck et al. | 204/192.22 |
| 5,904,966 | A | | 5/1999 | Lippens | |
| 6,365,010 | B1 | | 4/2002 | Hollars | |
| 7,544,884 | B2 | | 6/2009 | Hollars | |
| 7,785,921 | B1 | | 8/2010 | Juliano et al. | |
| 8,115,095 | B2 | | 2/2012 | Schmidt et al. | |
| 2005/0109392 | A1 | * | 5/2005 | Hollars | 136/265 |
| 2006/0137968 | A1 | * | 6/2006 | Hartig | 204/192.1 |

OTHER PUBLICATIONS

U.S. Appl. No. 13/038,611, "Method of Sensing Local Sputtering Target Selenization", filed Mar. 2, 2011.

* cited by examiner

*Primary Examiner* — Jason M Berman
(74) *Attorney, Agent, or Firm* — The Marbury Law Group PLLC

(57) ABSTRACT

A sputtering target has a cylindrical backing tube having two edges and a sidewall comprising a middle portion located between two end portions. The sputtering material is on the backing tube. The sputtering material does not cover at least one end portion of the backing tube. The sputtering target also has a feature which prevents or reduces at least one of chalcogen buildup and arcing at the at least one end portion of the backing tube not covered by the sputtering material.

23 Claims, 19 Drawing Sheets

SPUTTERING TARGET INCLUDING A FEATURE TO REDUCE CHALCOGEN BUILD UP AND ARCING ON A BACKING TUBE

FIELD OF THE INVENTION

The present disclosure generally relates to the field of sputtering targets used in the manufacturing of photovoltaic devices, and more specifically to forming thin-film solar cells by sputtering deposition. More particularly, the present disclosure relates to a backing tube that includes a feature that reduces chalcogen build up and arcing on an end portion of the backing tube not covered by the sputtering material.

BACKGROUND OF THE INVENTION

Copper indium diselenide ($CuInSe_2$, or CIS) and its higher band gap variants copper indium gallium diselenide ($Cu(In,Ga)Se_2$, or CIGS), copper indium aluminum diselenide ($Cu(In,Al)Se_2$), copper indium gallium aluminum diselenide ($Cu(In,Ga,Al)Se_2$) and any of these compounds with sulfur replacing some of the selenium represent a group of materials, referred to as copper indium selenide CIS based alloys. Copper indium selenide CIS based alloys have desirable properties for use as the absorber layer in thin-film solar cells. To function as a solar absorber layer, these materials should be p-type semiconductors.

SUMMARY OF THE INVENTION

One embodiment of this disclosure provides a sputtering target. The sputtering target comprises a cylindrical backing tube having two edges and a sidewall comprising a middle portion located between two end portions. The sputtering target also includes a sputtering material on the backing tube. The sputtering material does not cover at least one end portion of the backing tube. The sputtering target also has a feature which prevents or reduces at least one of chalcogen buildup and arcing at the at least one end portion of the backing tube, which is not covered by the sputtering material.

Another embodiment of the disclosure provides a method of making a sputtering target. The method comprises forming a sacrificial material around a circumference of an end portion of a backing tube. The method also forms a sputtering material on the middle of the backing tube and on the sacrificial material and around the circumference of the end portion of the backing tube. The method also includes removing the sacrificial material to leave a groove under an end portion of the sputtering material, which is adjacent to the end portion backing tube.

Another embodiment of the disclosure provides a sputtering method. The sputtering method comprises providing a sputtering target. The sputtering target comprises a cylindrical backing tube having two edges and a sidewall comprising a middle portion located between two end portions. The sputtering target also has a sputtering material on the backing tube. The sputtering material does not cover at least one end portion of the backing tube. The sputtering target further includes a feature which prevents or reduces at least one of chalcogen buildup and arcing at the at least one end portion of the backing tube that is not covered by the sputtering material. The method also comprises sputtering the sputtering material from the sputtering target such that chalcogen is contained in a sputtering ambient. The feature prevents or reduces at least one of or both of chalcogen deposits and arcing at the end portion of the backing tube.

DESCRIPTION OF THE PREFERRED EMBODIMENTS

Figure 1:
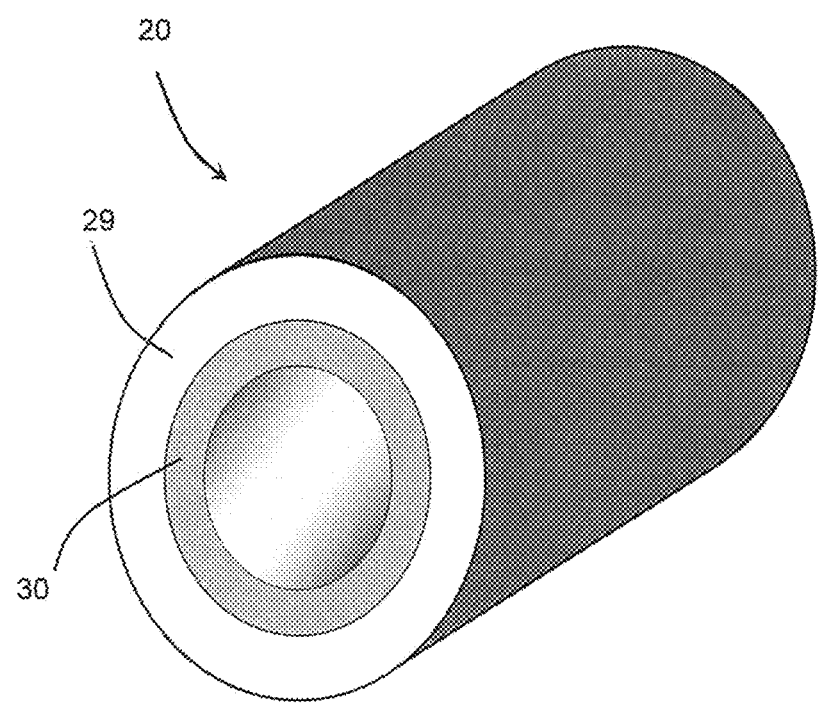
FIG. 1 shows a perspective cross-sectional view of a tubular sputtering target of a first embodiment of the present disclosure.

Rotary cathodes utilized in a "poisoned" process are susceptible to unipolar arcing due to a breakdown of insulating material, for example, a chalcogen insulating material. As used herein, the term chalcogen includes selenium, sulfur or a combination thereof. Optionally, the term chalcogen may also include tellurium but preferably excludes oxygen. While selenium is used as an example of a chalcogen in the description below, it should be understood that the insulating film may include a combination of sulfur and selenium or comprise sulfur instead of selenium. Selenium is an insulating material which builds up due to condensation on the relatively colder and non-eroded portion of a sputtering target. The selenium film may aggregate to a critical thickness that under a bias voltage of the target breaks down and arcs. This arcing may cause damage and creates other disfavored features that reduce a bias voltage that it takes to support the arcing. Arcing also reduces a product yield and ultimately reduces a sputtering tool productivity due to recovery through sputtering cleaning. A sputtering target may be internally cooled to remove heat caused by the sputtering. The active sputtering and heat flux are concentrated in high density regions of the sputtering target primarily in the "racetrack" portion in the sputtering material. The remaining areas of the sputtering target, such as the target backing tube ends are relatively colder relative to the sputtering material "racetrack" and are susceptible to selenium aggregation and condensation. In addition, any aggregation of selenium on the end portions of the backing tube may not be removed by sputtering. Shielding at the sputtering target end portions, such as shielding by a dark space shields which prevent re-deposition of the target sputtering material, also prevent radiation from reaching the target end portions. The dark space shielding blocks the thermal radiation from a substrate heater or from other hot sputtering chamber components, which may further cool the ends of the target backing tube and maintain the aggregated chalcogen film (e.g., selenium film or combination sulfur-selenium film) on the end portions of the backing tube. Embodiments of the invention provide one or more features which prevent or reduce selenium buildup on the end portion(s) of the backing tube.

In some sputtering systems, tubular rotatable targets are used, while in other systems, planar or stacked targets are used. For example, U.S. Pat. Nos. 4,356,073, and 6,365,010 which are hereby incorporated by reference herein in their entirety, disclose rotatable tubular targets. Also, U.S. Pat. No. 5,904,966, which is incorporated by reference herein in its entirety, provides a multi-layer target as a rotatable or static tubular structure, or alternatively, in the form of a flat plate. Thus, embodiments of the present disclosure provide a rotatable or static tubular sputtering target, such as comprising a feature that reduces or eliminates chalcogen deposits, such as selenium deposits, and arcing on the sputtering target.

For example, as illustrated in FIG. 1, a sputtering target 20 of a first embodiment of the present disclosure includes a sputtering material layer 29 comprising a first material useable for sputter depositing a chalcolgen (e.g., selenium, sulfur or sulfur and selenium) containing layer on a substrate (not shown in FIG. 1) and a support structure 30, such as a backing tube, comprising a second material. The sputtering material layer 29 may be a copper-indium-gallium alloy (e.g., 29-39 wt % copper, about 49-62 wt % indium, and about 8-16 wt % gallium), a CuIn alloy, a CuGa alloy, etc. which can be used in a reactive sputtering process, or a selenium containing material, such as a Cu—In—Ga—Se, Cu—In—Ga—S or Cu—In—Ga—S—Se alloy which can be used in a non-reactive sputtering process, to sputter deposit a copper indium selenide and/or sulfide (CIS) based semiconductor absorber layer, such as a CIGS layer, of a solar cell over the substrate. In the embodiment illustrated in FIG. 1, the support structure 30 comprises a backing tube comprising a metal, such as stainless steel, Mo, W, Ta, V, Ti, Nb, Zr, alloys thereof or nitrides thereof. An optional bonding layer (not shown) may be used to bond layer 29 to structure 30.

Figure 2:
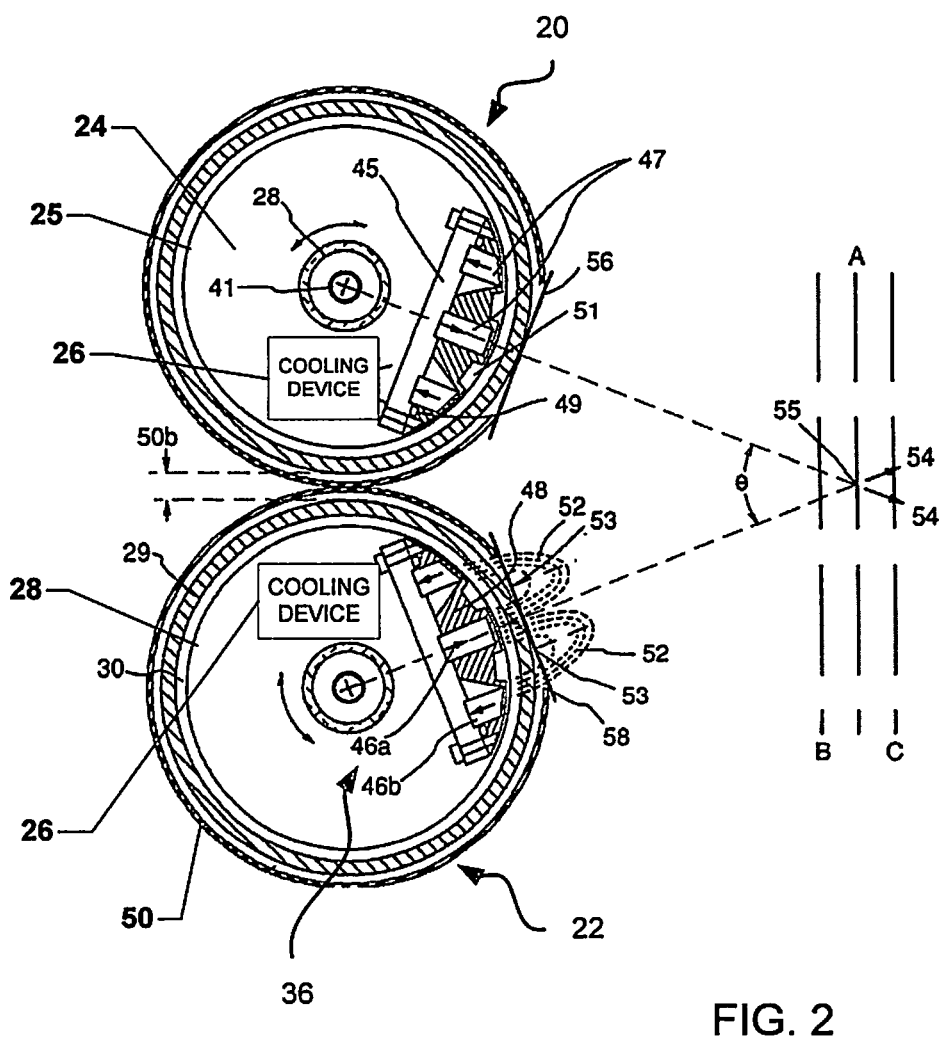
FIG. 2 shows a top cross-sectional view of a first and a second tubular sputtering target illustrating a cooling device being located in an interior of the first and the second tubular sputtering target.

FIG. 2 illustrates a first tubular sputtering target 20 and a second sputtering target 22 illustrating an interior space 24 contained therein. The interior space 24 includes a cooling device 26, such as a cooling water source which provides water on an interior surface 25 of the backing tube 30 (e.g., by spraying the water on the interior surface 25 or by filling the interior space 24 of the target with water). The cooling device 26 will lower the temperature of the ends of the sputtering targets 20 and 22 as cool surfaces whereby selenium will generally condense thereon from a vapor phase. FIG. 2 shows an exemplary, non-limiting top cross-sectional schematic view of a set of cylindrical magnetrons of the type illustrated in the U.S. Pat. No. 6,365,010. The section is taken through the tubular targets to show the details of magnet assembly 36.

Each magnet assembly 36 consists of backing plate 45 constructed from a water resistant metal or metal alloy (e.g., stainless steel, copper, etc.), with center 46a and outer magnets 46b (arrows indicate direction of magnetization) and their associated magnet pole pieces 47. Pole pieces 47 aid in smoothing out the magnetic field produced by magnets 46a and 46b if they are constructed from an array of smaller individual magnets. Semi-circular, non-magnetic housing 48 is sealed to backing plate 45 by O-ring 49 to prevent corrosion of the magnets from exposure to coolant from cooling device 26. The directions of magnetization of magnets 46a, 46b (indicated by arrows) may be reversed. However, all magnetron assemblies that are used in a given system usually have like magnetic orientation. The sputtering material 29 is surrounded by dark space shield 50, which is open in the region of the plasma defined by the magnet assemblies. The gap G between dark space shield 50 and material 29 is about 0.10 inches, a typical distance for sputtering at a pressure of a few millitorr. Shield 50 may be either electrically floating (as illustrated), or connected to system ground. It shields those regions of the tubular target surface which have been substantially cleaned by their passage past the sputtering region. The distance between the centers of the magnetrons is such that the surfaces of sputtering material 29 are separated by a distance 50b that is less than one inch and preferably about one-half inch. Channels 51 in housing 48 help to direct coolant along the back of the heated erosion zones of the tubular target.

Magnets 46a and 46b are preferably of the rare earth (NdFeB) type, which have very high energy density. They produce arced magnetic fields 52, which define erosion zones 53 (one racetrack-type area). In FIG. 2, source planes 56 and 58 are identified as containing the narrow erosion zones (approximating lines sources) and normal planes 54, perpendicular to the source planes and including the cylindrical axes of magnetrons, intersect at point 55 which typically is a few inches from the magnetrons. The included angle Θ between the normal planes is less than 90 degrees for most substrate positions.

Dashed line A illustrates a possible position for the substrate plane, which is discussed with respect to FIG. 18 below. Alternative substrate planes indicated by dashed line B (closer to the magnetrons) and dashed line C (further from the magnetrons) are potentially more optimum positions, but the exact location is dependent upon the details of the geometry and construction of the device.

Figure 3:
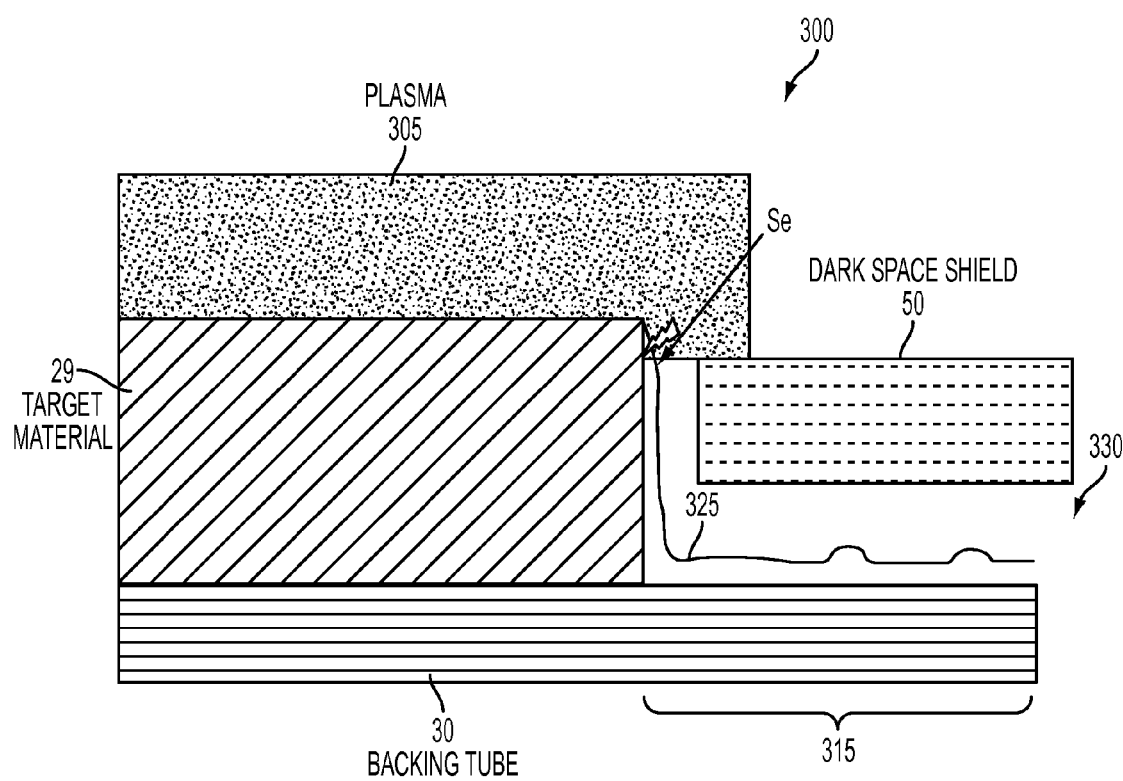
FIG. 3 shows a side cross-sectional view of a prior art tubular sputtering target end portion illustrating a buildup of chalcogen at the end of the backing tube near the dark space shield in a dark shield space.

FIG. 3 illustrates a side cross sectional view of an end portion 300 of a prior art sputtering target that includes a target sputtering material 29, a backing tube 30, and a dark space shield 50. The end portion 300 includes a dark space 330 that is located between the dark space shield 50 and the end portion 315 of the backing tube 30 which is not covered by the target's sputtering material 29. As shown, since the end portion 315 of the backing tube is relatively cooler than the sputtering material 29 due to the location of plasma 305 near material 29, condensation of selenium as layer 325 will occur on the end portion 315 of the backing tube in the dark space 330 and arcing may result during the sputter deposition.

Figure 4:
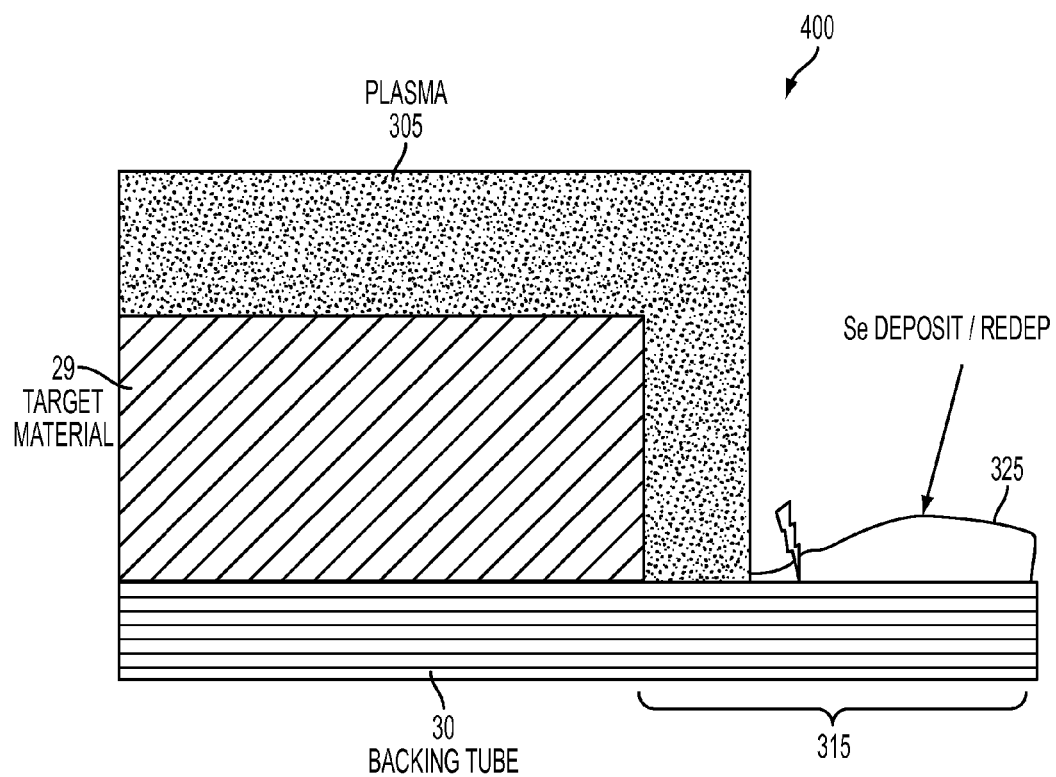
FIG. 4 shows a side cross-sectional view of a prior art tubular sputtering target end portion illustrating a deposit of chalcogen on the end portion of the backing tube that is not covered by the dark space shield.

FIG. 4 illustrates a side cross sectional view of an end portion 400 of a prior art sputtering target that does not include a dark space shield. Again, since the end portion 315 of the backing tube 30 is relatively cooler that the sputtering material 29, the condensation of the selenium layer 325 will occur on the relatively cooler backing tube 30 end portion surface and arcing may result during the sputter deposition.

Embodiments of the invention provide one or more features that prevent or reduce selenium buildup and arcing on the end portion(s) of the backing tube. In the first embodiment, the feature is a dielectric coating on the outer surface of the end portion of the backing tube. In the second embodiment, the feature is a heated shield adjacent to the end portion of the backing tube. In the third embodiment, the feature is a heater configured to selectively heat the end portion of the backing tube. In the fourth embodiment, the feature is a thermally insulating material layer inside the backing tube at the end portion of the backing tube. In a fifth embodiment, the feature is a groove or a thermally insulating material located between an end portion of the sputtering material and the end portion of the backing tube. In a sixth embodiment, the feature is a ring shield having poor thermal contact to the sputtering material or to the end portion of the backing tube. Any of these features may be used alone or in any combination with any one or more of the other features.

Figure 5:
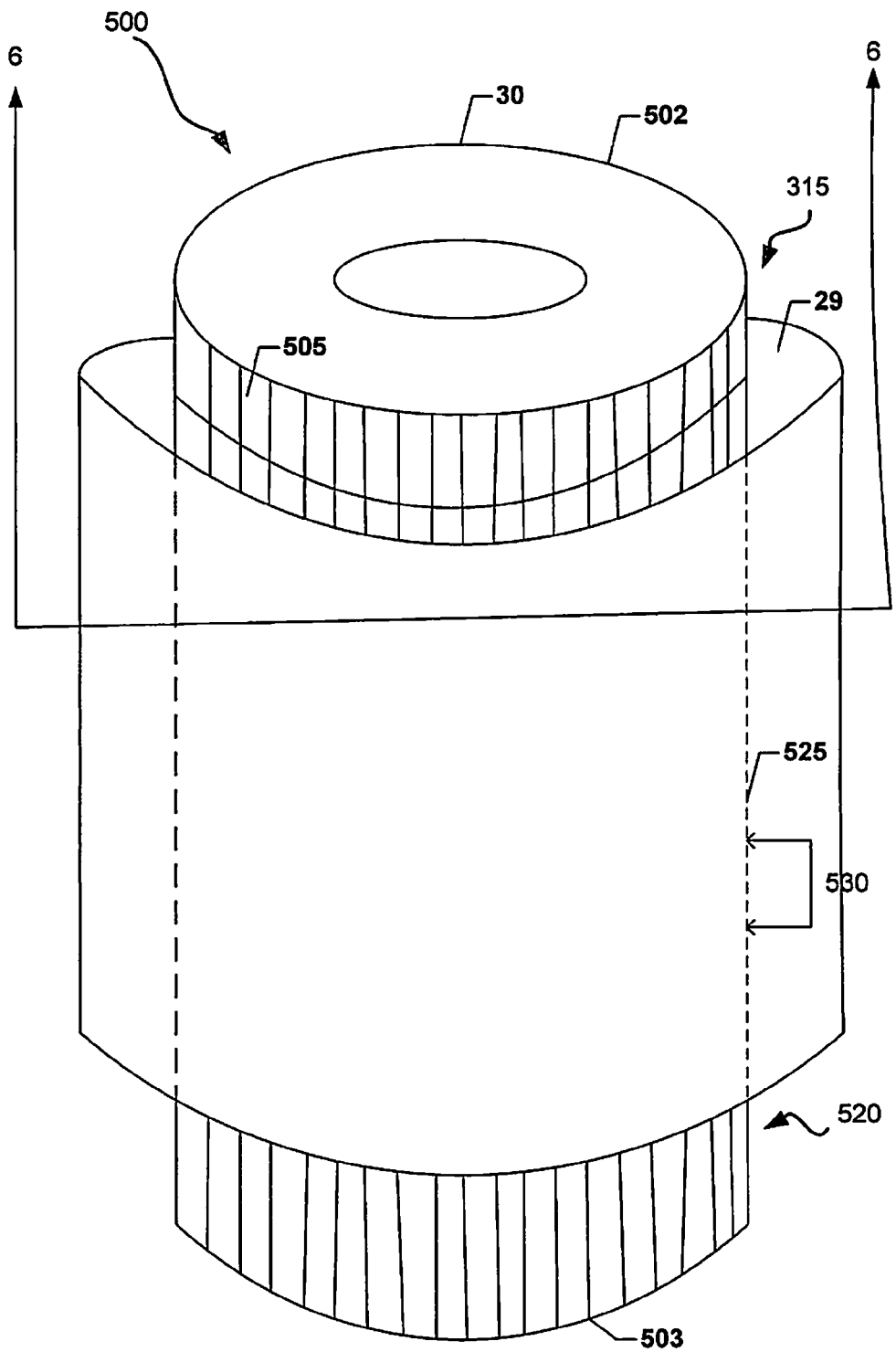
FIG. 5 shows a perspective view of a tubular sputtering target of the present disclosure that includes an epoxy dielectric coating layer at the end portions of the backing tube.

FIG. 5 illustrates a high level schematic of a sputtering target 500 that includes the dielectric coating feature 505 of the first embodiment. The sputtering target 500 includes a cylindrical backing tube 30 having two edges 502 and 503 and a sidewall 525 comprising a middle portion 530 located between two end portions 315 and 520. The end portions 315 and 520 are each defined by a portion of the backing tube 30 measured from the respective edges 502 and 503 and which terminate generally in the middle portion 530 about where the target sputtering material 29 is disposed. However, the end portions 315 and 520 may refer to any relatively cooler space on the backing tube 30 where selenium may aggregate and condense from the vapor phase to form a film. The sputtering target 500 also includes a sputtering material 29, such as the CIG alloy, on the middle portion 530 of the backing tube 30. The sputtering material 29 does not cover both or at least one end portion 315 and 520 of the backing tube 30. The at least one end portion 315 and 520 of the backing tube 30 includes the feature 505 which prevents or reduces at least one of selenium buildup and arcing at the at least one end portion 315 and 520 of the backing tube 30.

Figure 18:
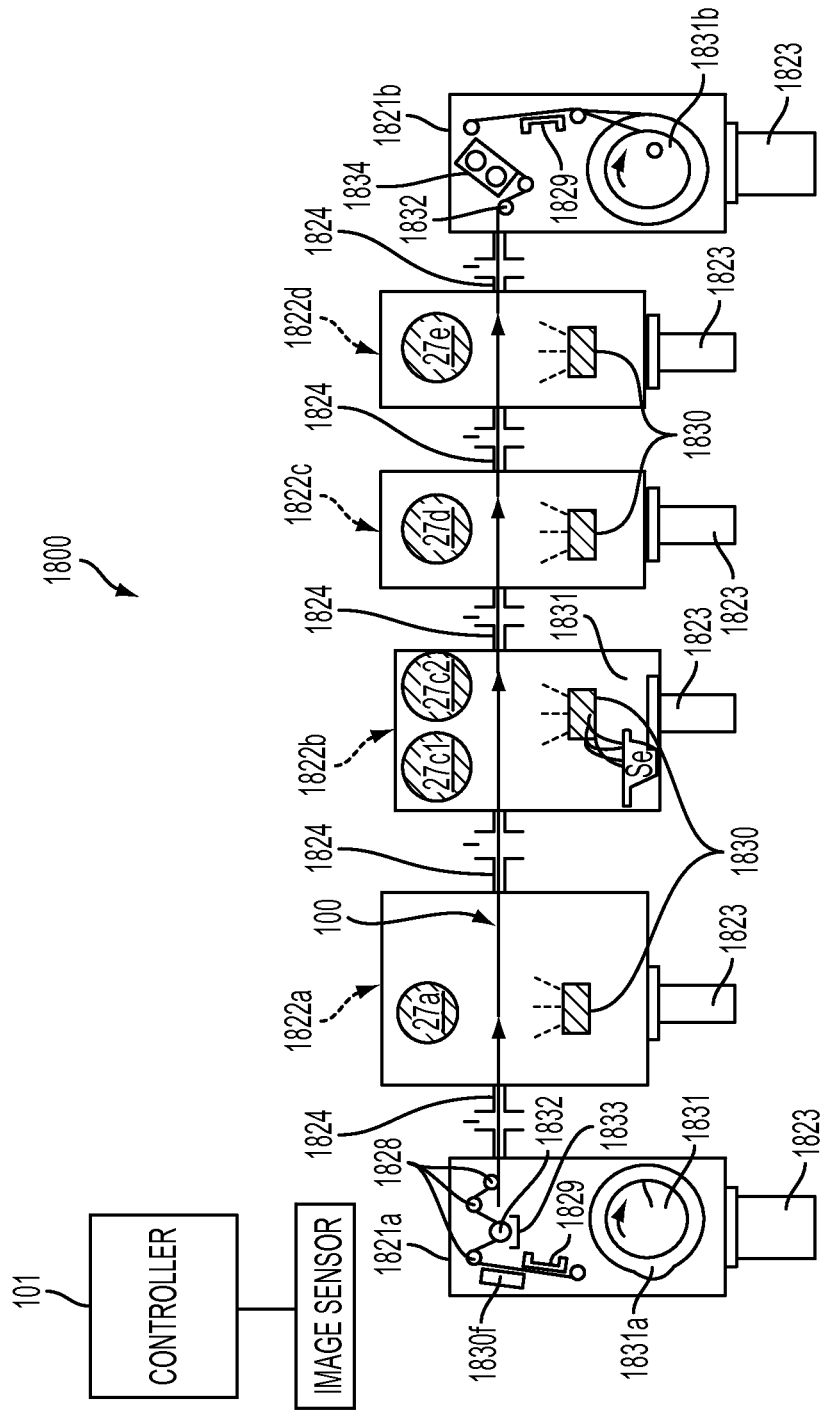
FIG. 18 illustrates a schematic top view of sputtering apparatus that can be used to manufacture the solar cell depicted in FIG. 19 according to an embodiment of the present disclosure.

The sputtering target 500 is incorporated into a reactive sputtering apparatus 1800 shown in FIG. 18 that includes a chamber for containing the sputtering target and a sputtering source. The sputtering source may be a magnetron 36 shown in FIG. 2 configured to be located inside the backing tube 30. The sputtering apparatus may also include a selenium source which provides selenium in the chamber, which is discussed in detail below. The backing tube 30 may be made from steel in this embodiment or from any other material that generally will not react with the sputtering deposition process.

Figure 6:
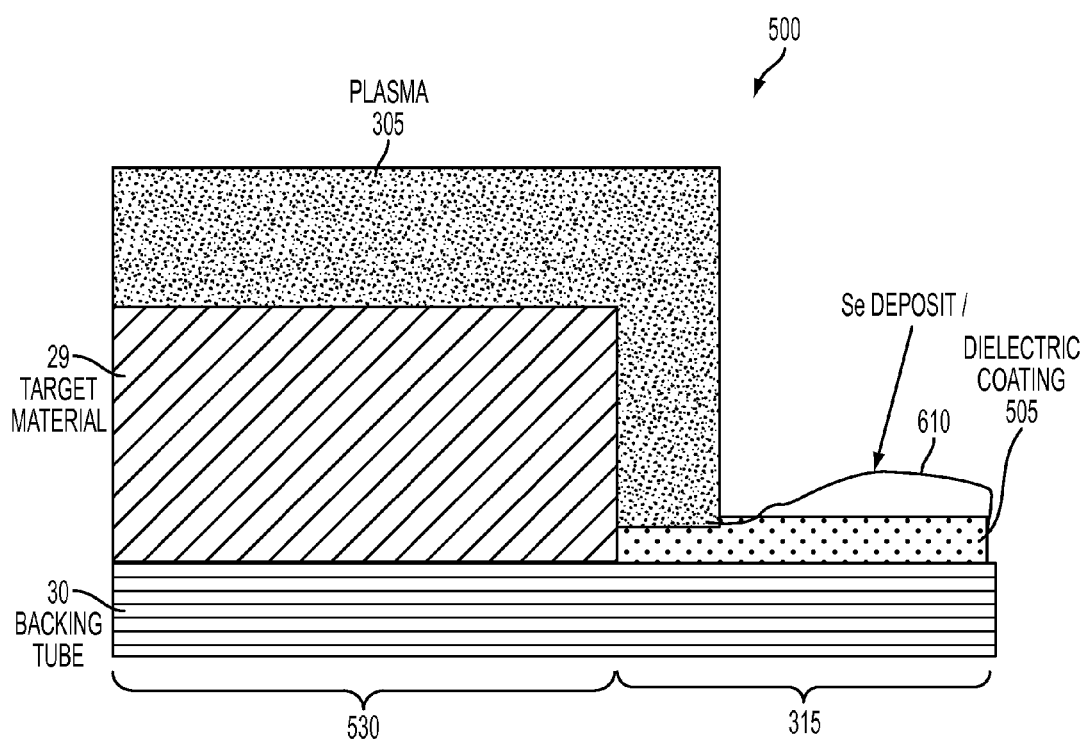
FIGS. 6 and 7 are cross sectional views of the end portion of the backing tube of FIG. 5 that includes a dielectric coating to reduce chalcogen deposits.

In this embodiment, the feature 505 includes a dielectric material 505 disposed on the end portions 315 and 520 of the backing tube. FIG. 6 shows a side cross sectional view of the sputtering target along line 6-6 of FIG. 5 illustrating the dielectric layer or coating 505 covering the end portion 315. The sputtering target 500 may be located in a reactive sputtering chamber having plasma 305 and having a selenium source as discussed with respect to FIG. 18 below. The dielectric coating 505 prevents the condensed selenium layer from contacting the at least one end portion 315 of the backing tube 30. The dielectric coating 505 may be an epoxy (e.g., polyepoxide which is a thermosetting polymer formed from reaction of an epoxide resin with a polyamine). Alternatively, the dielectric coating 505 may be a different polymer, a glass, a ceramic, or a crystalline electrical non-conductor. The dielectric coating 505 can be applied as a tape on the end portion 315 of the backing tube 30 or the dielectric coating 505 can applied via an adhesive on the end portion 315 of the backing tube 30. The dielectric coating 30 may alternatively be at least a portion of an insulating sleeve which is disposed around the end portion 315 of the backing tube 30. Still alternatively, the dielectric coating 505 can be formed as a thin film on the end portion 315 of the backing tube 30 by any suitable thin film deposition method, such as physical vapor deposition, chemical vapor deposition, oxidation of the end portion of the backing tube 30, and/or anodization of the end portions of the backing tube 30. Various insulating configurations are possible and within the scope of the present disclosure.

The dielectric layer 505 may be utilized with or without a dark space shield 50 shown in FIG. 3, which is omitted from FIG. 6 for clarity. The insulating coating 505 has a sufficient dielectric strength to not break down in a sputtering atmosphere. The insulating coating 505 also allows an amount of selenium to build up and aggregate as a film or deposit 610 on the dielectric coating 505, as shown in FIG. 6, to keep the selenium deposit 610 from contacting the powered surface of the backing tube 30 of the rotary cathode target. This maintains the plasma coverage of the middle target portion 530 where the sputtering material 29 is located and reduces or prevents arcing.

Figure 7:
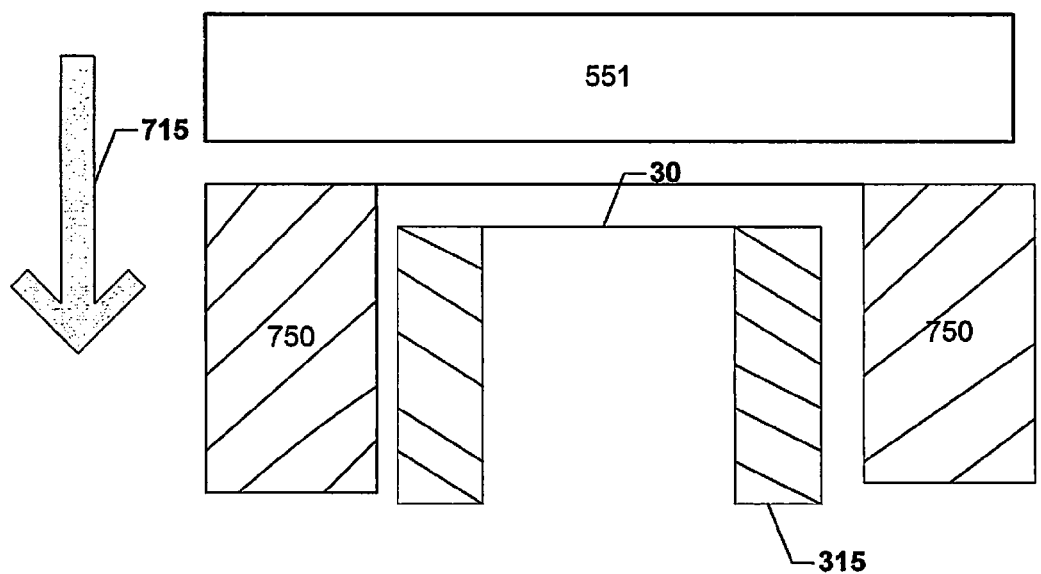

As noted above, the insulating material 505 may be formed as a ceramic, quartz or polymer sleeve 750, which is shown in FIG. 7. The sleeve 750 may be aligned and installed over a backing tube 30 end portion 315. The insulating material of sleeve 750 may extend into an area of the sputtering plasma atmosphere 305 that is enhanced by a magnetic field of the magnetron of the sputtering source. This extension into the high density plasma keeps the selenium from building up on a surface of the sputtering target 500 (other than on layer 505). The sleeve 750 can be slid over the backing tube 30 end portion 315 in the direction of reference arrow 715 and can be held in place by a disk shaped cap 551. Alternatively, the sleeve 750 can be held in place by an adhesive dielectric material 505 which is fixed directly to the backing tube 30 as a tape or a spray-on coating.

Figure 8:
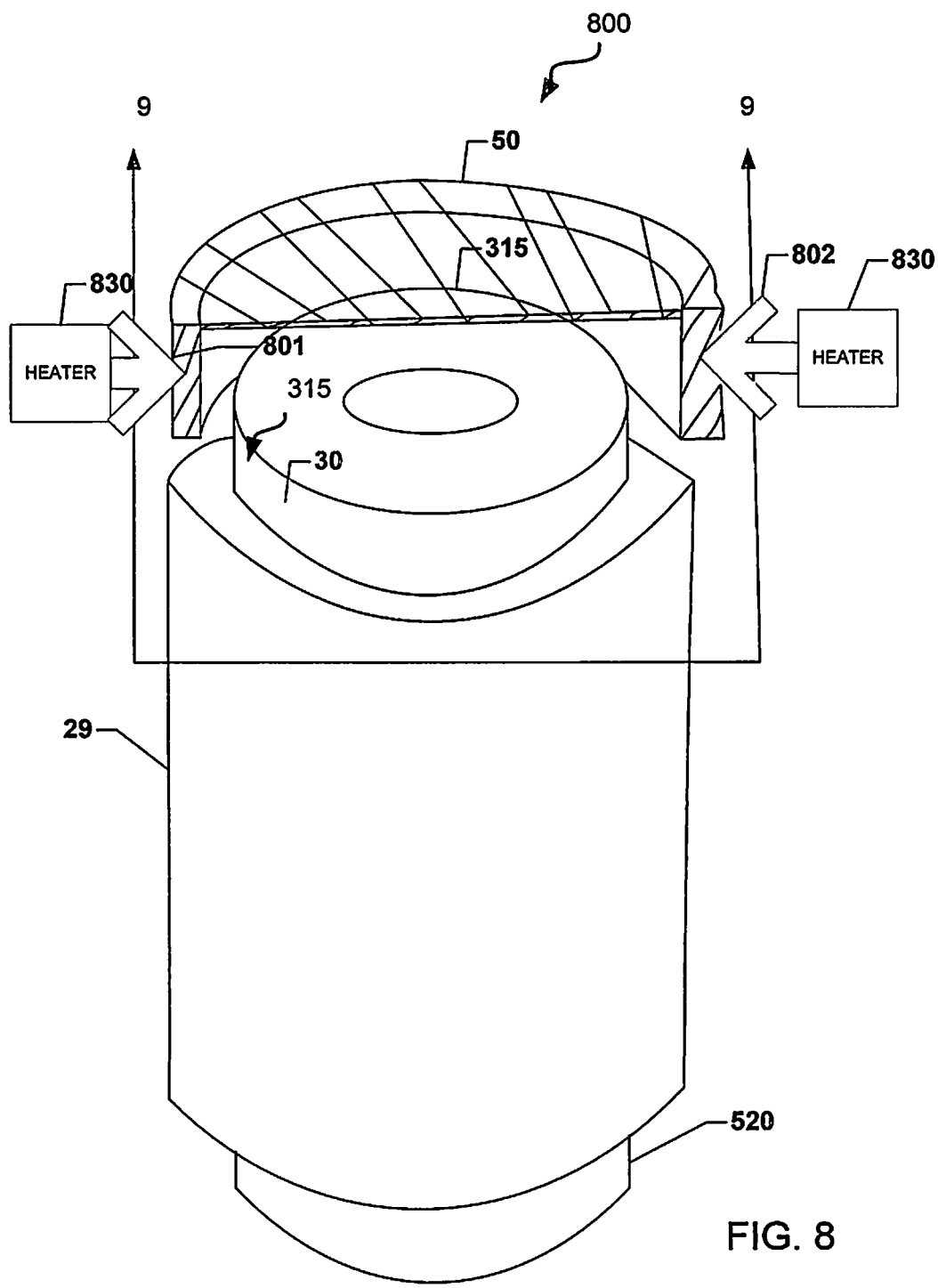
FIG. 8 shows a perspective view of a sputtering target according to the present disclosure and a heated dark space shield providing thermal energy to the backing tube end.

FIG. 8 illustrates the heated shield of the second embodiment of the invention. FIG. 8 shows a perspective, partially exploded view of a backing tube 30 end portion 315 including a feature that includes a heated dark space shield 50 adjacent to the at least one end portion 315 of the backing tube 30 of target 800. The heated shield 50 reduces the arcing rate by preventing or reducing selenium accumulation on the end portion 315 of the backing tube by heating the end portion 315 above the condensation point of the selenium material. Heating is shown schematically by arrows 801, 802.

Figure 9:
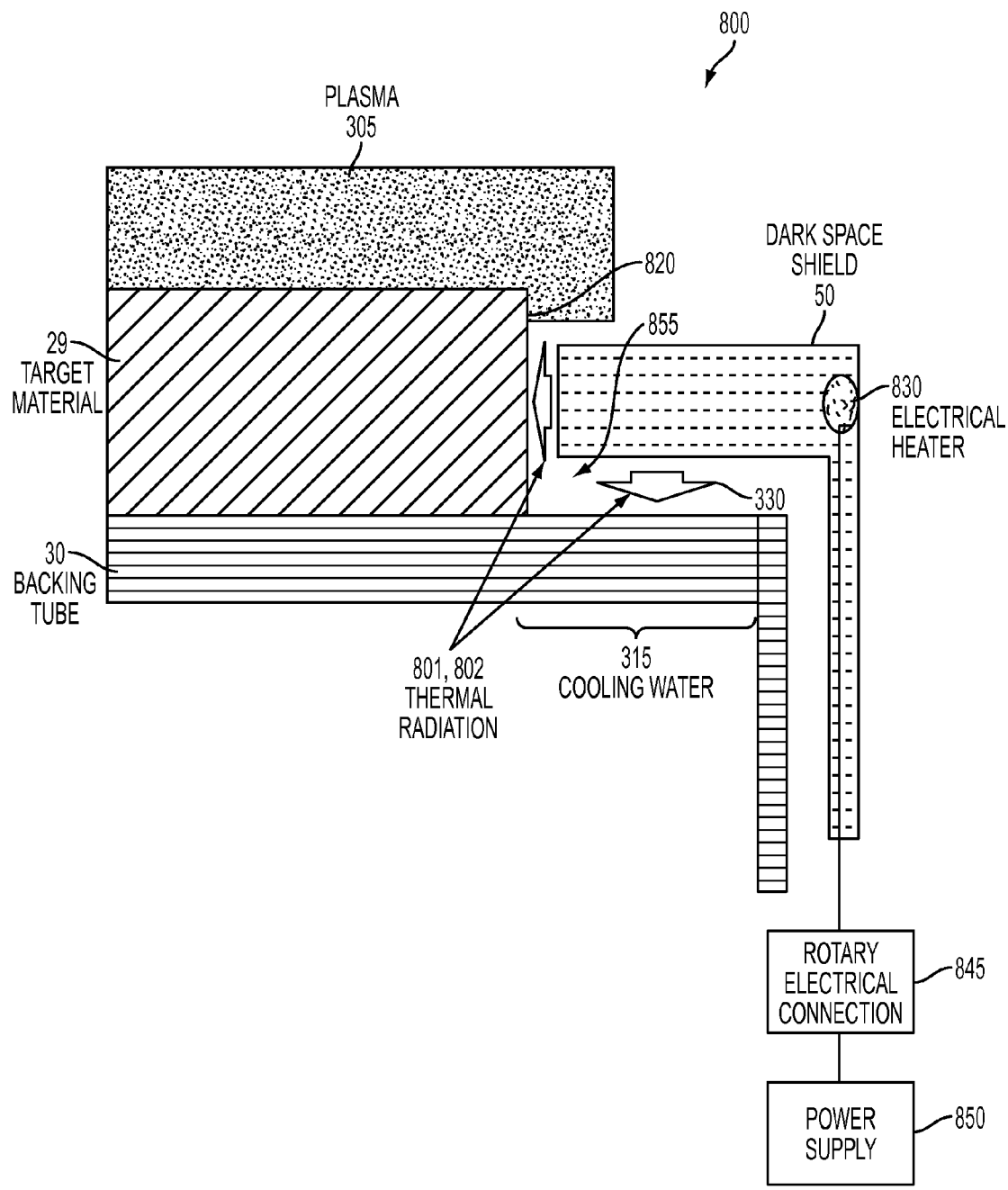
FIG. 9 illustrates a side cross sectional view of the sputtering target of FIG. 8 illustrating the heater contained in the dark space shield that imparts thermal energy to the backing tube end to prevent or reduce chalcogen from aggregating thereon.

Turning now to FIG. 9, there is shown a partial, rotated cross sectional view of the backing tube end portion 315 of target 800 along line 9-9 of FIG. 8. As shown in FIG. 9, the shield 50 can be spaced from the end portion 315 of the backing tube 30. The shield 50 also may extend adjacent to an edge 820 of the sputtering material 29 such that the shield is located above the sputtering material 29 (or below the material 29 on the bottom portion of the target) and preferably does not overlap with material 29. A dark space 855 is located between the backing tube 30 and the shield 50. The shield 50 may be a stationary shield or a rotating shield.

In one embodiment, a stationary heater 830 shown in FIG. 8 can be located adjacent to a rotating shield 50. In operation, the shield 50 rotates about its axis within the plasma 300 shown in FIG. 9. For example, the stationary heater 830 may heat the spaced apart shield 50, which in turn heats the end portion 315 of the backing tube 30.

In another embodiment, the heater and the shield are in physical contact. For example an embedded heater 830 may be located within the shield 50, as shown in FIG. 9. In yet another embodiment, the heater 830 may be attached to the side of the shield 50, or the shield 50 itself may be manufactured from a resistance heater 830 material and connected to a power supply. If the shield 50 is a rotating shield, then the heater 830 may include a rotary electrical connection 845 coupling a power supply 850 to the heater 830, as shown in FIG. 9. Connection 845 may be for example, a brush and commutator (or another suitable a rotary electrical switch) connection. This allows the heater 830 to rotate with the shield 50 and backing tube 30.

Alternatively, the heater 830 may not be a resistance heating element, but instead may be a heat lamp or another radiative or convective heater which can be directed at the end portion 315 of the backing tube 30 and/or at the shield 50. For example, the heater(s) 830 shown in FIG. 8 may comprise heat lamps which are directed at the shield 50 and/or at the backing tube end portions. Other heater types, such as inductive heaters, etc. may also be used.

Figure 10:
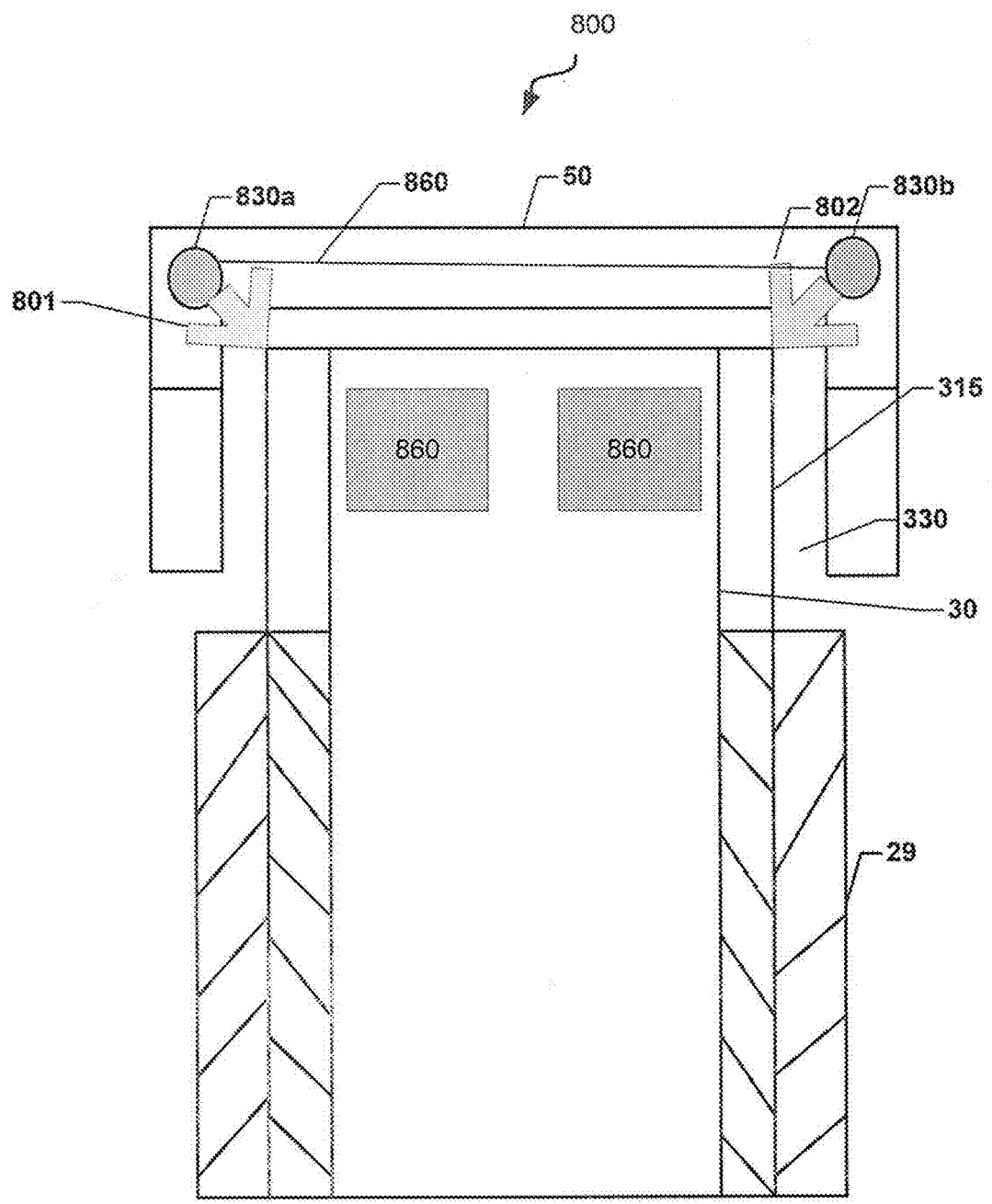
FIG. 10 shows a simplified high level diagram of the dark space shield having a first and a second heater contained in a groove in the shield at an end of the backing tube where the sputtering material does not cover the backing tube.

FIG. 10 is a side cross sectional view of an upper portion of the target 800 including the dark space shield 50 and the backing tube 30. FIG. 10 illustrates a first and a second embedded heater 830a and 830b in the shield 50 for heating an end portion 315 of the backing tube 30. The dark space shield 50 is not limited to two heaters 830a and 830b and may include a single heater or more than two heaters 830a and 830b or any amount of heating elements to elevate the temperature at the end portion 315 and to reduce selenium aggregation and arcing at the end portion 315. The dark space shield 50 may be manufactured from a high thermal conductivity material, such as aluminum. The one or more embedded heaters 830a and 830b may be one or more tubular or cartridge heaters 830a and 830b, which can be inserted into grooves in the dark space shield 50.

In the third embodiment, the backing tube 30 may also include one or more heaters 860, which are located adjacent to the end portion(s) 315 of the backing tube 30 in addition to or instead of the heater(s) 830. For example, heater 860 may be located inside the hollow backing tube 30 at the end portion 315, as shown in FIG. 10. The heater 860 may be attached to the inner surface of the tube 30, or be embedded into the wall of the tube 30 or it may be located adjacent but not in contact with the wall of the tube 30. The heater(s) 860 are used to heat the end portion(s) 315 of the backing tube to reduce or prevent selenium deposition on the end portion(s).

Figure 11:
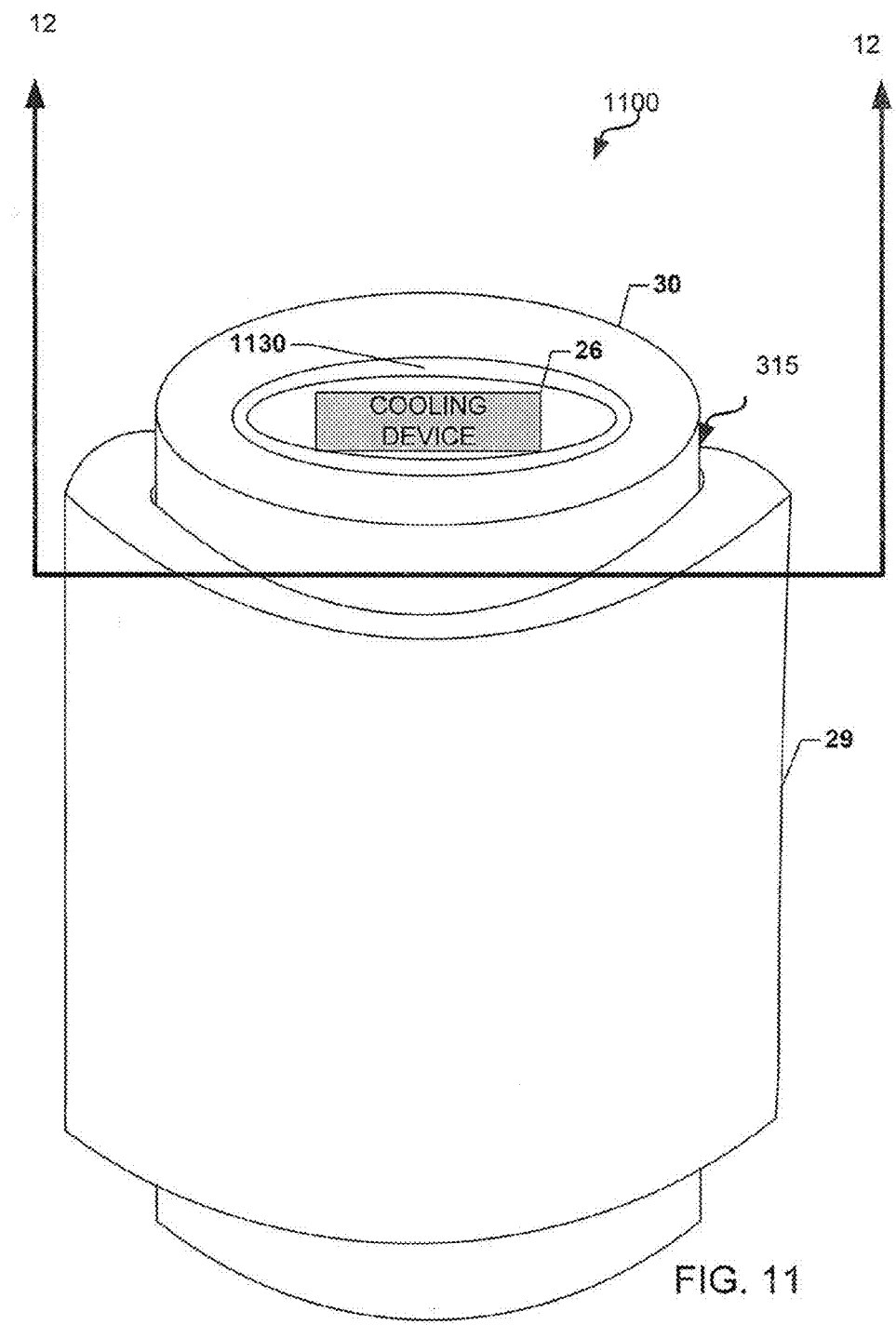
FIG. 11 illustrates a perspective view of a sputtering target according to the present disclosure, including a dark space shield and a cooling device contained in an interior of the backing tube.
Figure 12:
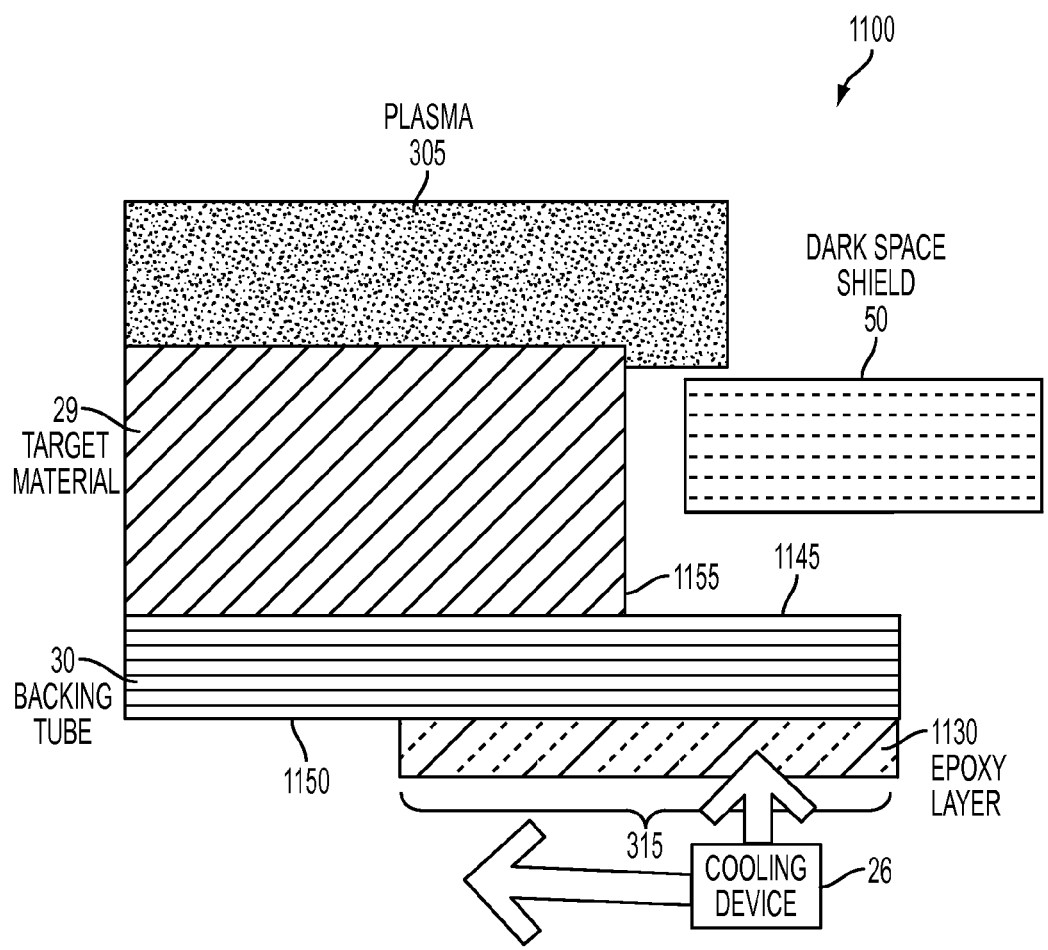
FIG. 12 illustrates a side cross sectional view of the sputtering target of FIG. 11 illustrating a dielectric layer placed in an inner portion of backing tube at the end portion to reduce or prevent cooling the backing tube end portion and to prevent or reduce chalcogen from condensing and aggregating thereon.

FIG. 11 illustrates a high level schematic view of a rotary target 1100 according to the fourth embodiment. In this embodiment, the rotary target (i.e., cathode) 1100 includes a backing tube 30 containing an end portion 315 and a cooling device 26, which is located inside the backing tube 30. In this embodiment, the feature that prevents or reduces arcing and selenium buildup comprises a thermally insulating material 1130 which blocks the cooling water (or another cooling fluid) provided by the cooling device 26 from overcooling the end portion 315 of the backing tube 30. This keeps the end portion 315 above the selenium condensation temperature. For example, the thermally insulating material layer 1130 is disposed on an inner surface 1150 of the end portion 315 of the backing tube 30 to block the cooling device 26 from overcooling the end portion 315, as shown in FIG. 12. Layer 1130 may be disposed on the inner surface of both end portions of the backing tube but not on the inner surface of the middle portion of the backing tube. Layer 1130 may have a thermal conductivity of less than 10 W/mK, such as 0.005 to 5 W/mK, including 0.1 to 1 W/mK and 1 to 5 W/mK.

FIG. 12 illustrates a rotated, partial cross sectional view of FIG. 11 along line 12-12 in FIG. 11. FIG. 12 illustrates a target material 29 supported on the outer surface of the middle portion of the backing tube 30. The sputtering target 1100 also includes an optional dark space shield 50, which is spaced from the backing tube 30 and which is located adjacent to the target material 29. The thermally insulating material 1130 may be a thermally insulating tape, thin film, or epoxy layer, which reduces effect of cooling water 26 inside the backing tube 30 on the end portion 315 of the backing tube. Material 1130 may be directly applied by chemical or mechanical bonding, tape winding or thin film deposition (e.g., CVD, sputtering, plating, spin-on coating, etc.). If desired, the target material 29 on the outer surface 1155 of the backing tube may extend slightly into the end portions 315 of the tube 30 to slightly overlap the end of the layer 1130 on the inner surface of the tube.

The incident energy from the plasma 305 and/or other radiant heat sources (e.g., heaters) impinges on the portion 1145 of the outer surface 1150 of the end portion 315 of the backing tube that would normally condense selenium, thus heating this surface portion 1145. The thermally insulating layer 1130 limits the thermal conduction of the backing tube and raises the surface 1145 temperature by increasing the temperature difference, $\Delta T$, for the same heat, Q, input ($Q=K*thickness(\Delta T/Area)$). By selecting a material forming the layer 1130 that has a low thermal conductivity, the desired temperature at the end portion 315 can be engineered for a specific $Q_{in}$ and a cooling configuration.

Figure 13:
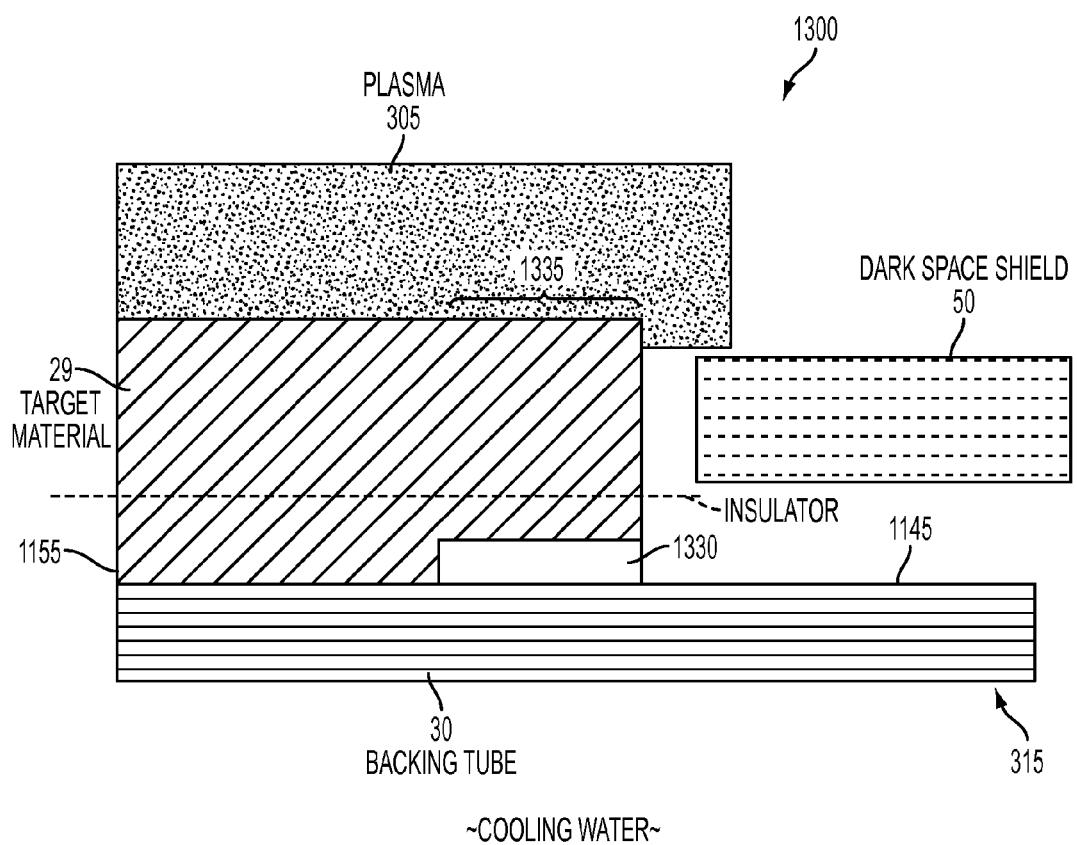
FIG. 13 illustrates a side cross sectional view of the sputtering target illustrating an insulating layer between the sputtering material and the backing tube end portion to reduce or prevent chalcogen from condensing and aggregating on the backing tube end portion.

In the fifth embodiment shown in FIG. 13, direct thermal contact between the end of the target material 29 and the backing tube 30 of the target 1300 is interrupted to prevent or reduce arcing. In one configuration of this embodiment, direct thermal contact between the end of the target material 29 and the backing tube 30 is interrupted by a thermally and electrically insulating material. Thus, the thermally insulating material 1330 is located on the outer surface 1155 of the backing tube instead of or in addition to being located on the inner surface 1150 of the backing tube. In this embodiment, the thermally insulating material 1330 is located between the inner surface of the end portion 1335 of the sputtering material 29 and the outer surface 1155 of backing tube 30. In other words, material 1330 may be located in a groove between an end portion of the sputtering material and the backing tube, such that the end portion 1335 of the sputtering material rests on material 1330 while the middle portion of the sputtering material 29 rests on the outer surface 1155 of the backing tube 30, as shown in FIG. 13. Material 1330 may be omitted on portion 1145 of the outer surface of the end portion 315 of the backing tube 30 that is not covered by the sputtering material 29. Of course the thermally insulating material may also be located on portion 1145 to have the configuration shown in FIG. 6. In this embodiment, the layer 1330 may be made from a thermally insulating ceramic material, such as alumina ($Al_2O_3$) or zirconium oxide ($ZrO_2$), to be able to withstand the plasma 305 sputtering conditions. The ceramic material 1330 may be deposited by sputtering or other thin film deposition methods on the backing tube followed by forming the sputtering material 29 over the ceramic material by any suitable deposition method.

Figure 14:
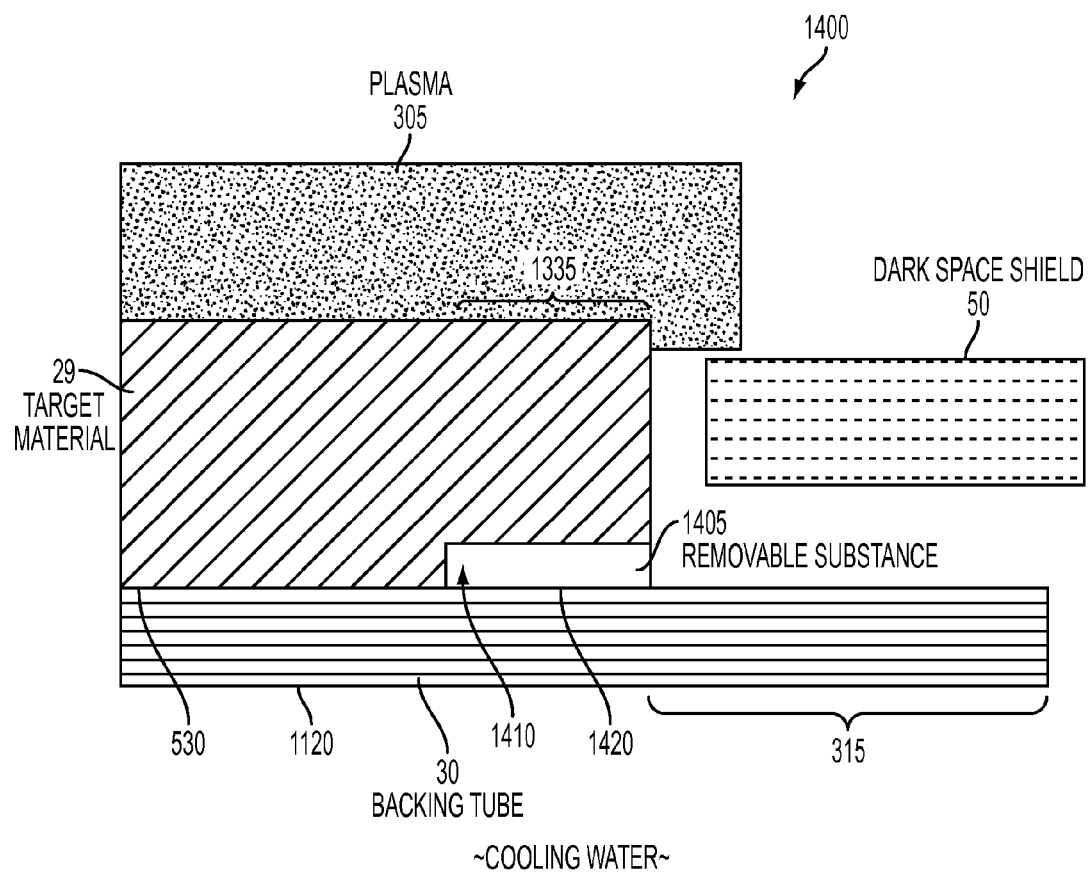
FIG. 14 illustrates a side cross sectional view of the sputtering target illustrating a sacrificial material between the sputtering material and the backing tube end portion to form a notch under the sputtering material.
Figure 15:
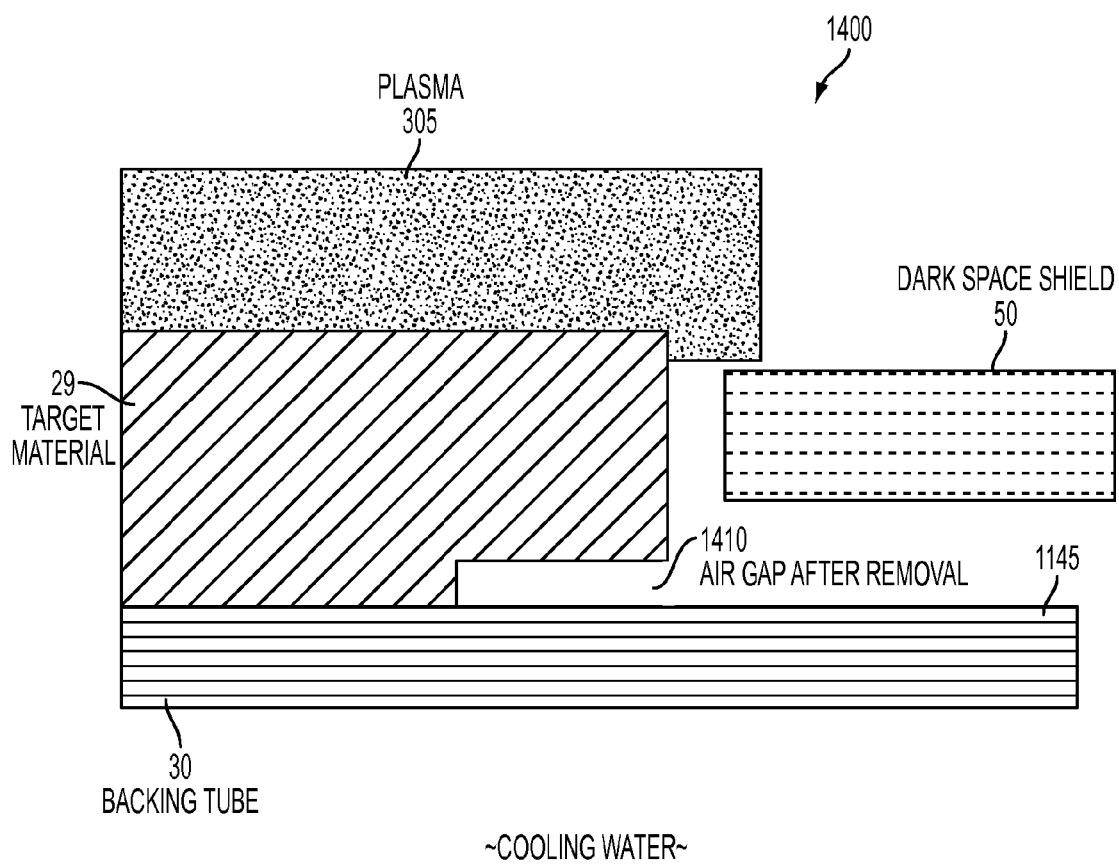
FIG. 15 illustrates a side cross sectional view of the sputtering target illustrating a notch formed underneath the end portion of the sputtering material to prevent or reduce chalcogen from condensing and aggregating on the backing tube end.

In another configuration of the fifth embodiment, direct thermal contact between the end of the target material 29 and the backing tube 30 of target 1400 is interrupted by a groove 1410 (e.g., a gap or trench) between the material 29 and tube 30, as shown in FIG. 15. The groove 1410 may be formed by forming a layer of a sacrificial material 1405 between the end portion 1135 of the target material 29 and the backing tube 30, as shown in FIG. 14. Sacrificial material 1405 may be formed on the outer surface of backing tube by any suitable method, followed by forming the sputtering material 29 over the sacrificial material 1405 by any suitable deposition method. The sacrificial material 1405 is then removed to form the groove 1410 as shown in FIG. 15.

The sacrificial material 1405 can be a water soluble polymer, a metal or ceramic, or any other sacrificial material. The sacrificial material 1405 may be selectively chemically removed, such as by selective etching, wetting the water soluble polymer, aging and breaking down a polymer by oxygen contact, UV exposure of a radiation sensitive material (e.g., photoresist or similar material), etc. Alternatively, the sacrificial material 1405 may be a layer of rubber or another flexible material 1405 which can be pulled out from under the sputtering material 29 due to its elastic material to leave the groove 1410 shown in FIG. 15.

Thus, a method of making a sputtering target 1400 includes forming a sacrificial material 1405 around a circumference of an end portion 315 of a backing tube 30 and forming a sputtering material 29 on a middle portion 530 of the backing tube 30 and on the sacrificial material 1405 around the circumference of the end portion 315 of the backing tube 30. Then, the sacrificial material 1405 is removed, or otherwise eliminated to leave a groove 1410 under an end portion 1335 of the sputtering material 29 adjacent to the end portion 315 of the backing tube 30. Alternatively, the sacrificial material 1405 may be omitted and the groove 1410 may be made by mechanical cutting or chemical etching of the sputtering material 29 to backing tube 30 bonding layer or by simply mechanically or chemically undercutting the sputtering material to form the structure in FIG. 15.

Figure 16:
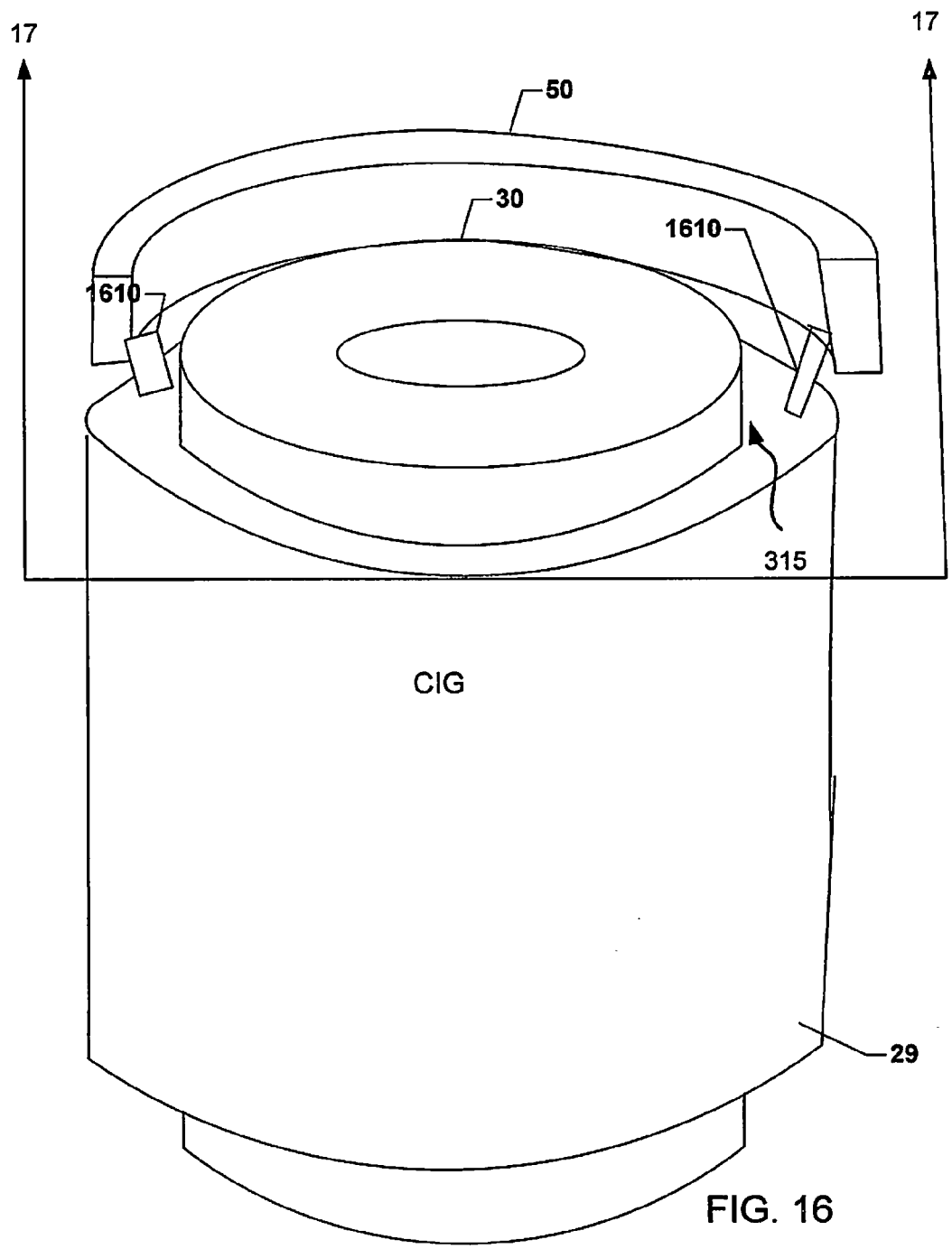
FIG. 16 illustrates a perspective view of a sputtering target according to another embodiment of the present disclosure illustrating a dark space shield and a sacrificial ring for heating the end portion of the backing tube.
Figure 17:
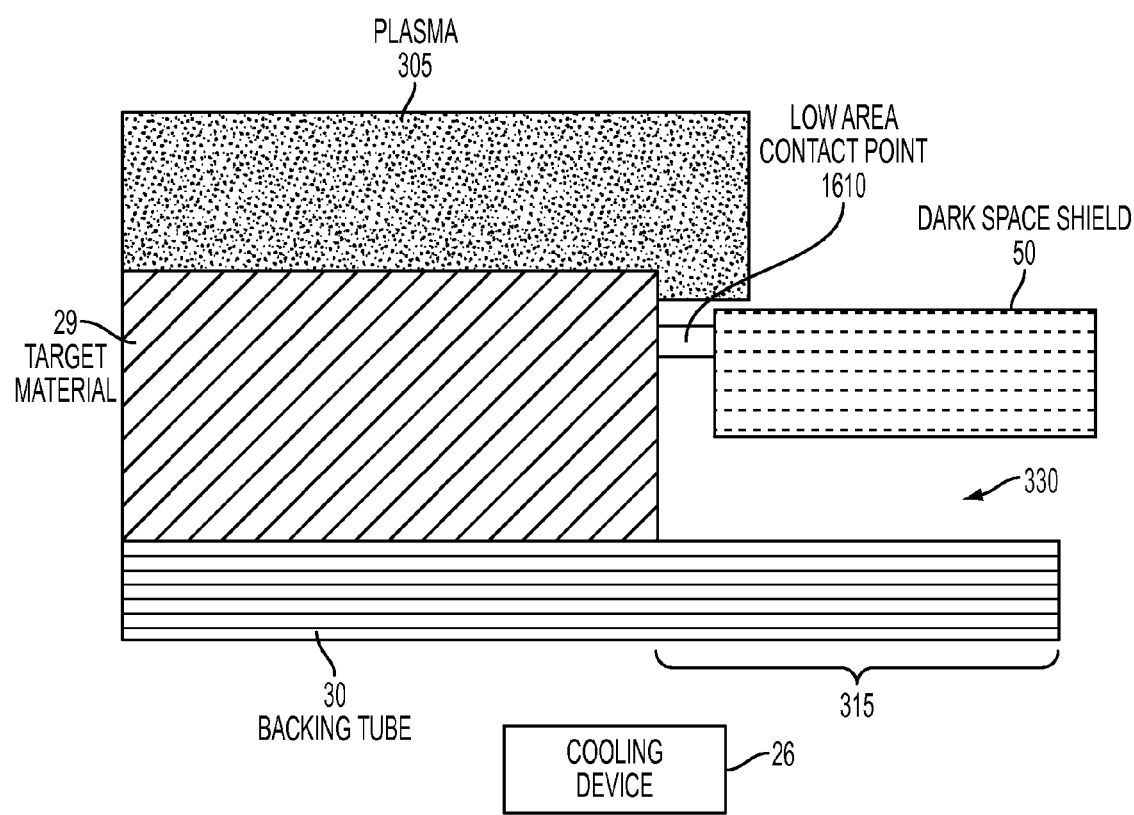
FIG. 17 illustrates a side cross sectional view of the sputtering target of FIG. 16 showing a sacrificial ring connecting the sputtering material and the dark space shield.

FIG. 16 shows a sixth embodiment of the invention, in which the sputtering material 29 is connected to a ring shaped dark space shield 50 by one or more contacting members 1610. The shield 50 sets off a dark space 330 at the end portion 315 of the backing tube 30, as shown in FIG. 17, which is a cross sectional view taken along line 17-17 of FIG. 16. The contacting members 1610 may have any suitable shape as long as they provide a poor thermal contact between the shield 50 and the material 29. For example, the members 1610 may comprise one or more thin metal bars or rods, such as 3-6 bars or rods, whose ends contact the bottom edge of the shield 50 and the top edge of the material 29, as shown in FIGS. 16 and 17. This provides small contact points between the shield 50 and the material 29. Alternatively, the member 1610 may comprise a thin ring optionally having one or more cut outs which whose top and bottom edges contact the bottom edge of the shield 50 and the top edge of the material 29, respectively. The member(s) 1610 may comprise integral protruding portions of the shield 50 or they may comprise separately formed pieces which are attached to the shield 50 using welding, clamping, brazing, bolting, etc. The member(s) 1610 may contact the material 29 by pressure fitting or other suitable methods. In an alternative configuration, the members 1610 may contact the end portion 315 of the backing tube 30 instead of or in addition to contacting the sputtering material 29. The temperature of the shield 50 is maintained such that the selenium will not condense on it due to heat provided to the shield from the incident energy from the plasma and the sputtering chamber heaters. The poor thermal path from the shield 50 to the sputtering material 29 and/or the backing tube 30 decreases or eliminates the resulting arcing.

Because the shield 50 and the members 1610 are in direct contact with the sputtering material 29, they will also be held at the target potential and may sputter. Thus, it is preferred to select the material of the shield 50 and the members 1610 which does not contaminate the deposited film in the sputtering process. For example, if the sputtering process is used to reactively sputter a CIGS layer from a CIG alloy sputtering material 29 in a selenium containing ambient, then the shield 50 and/or the members 1610 may be made from aluminum, copper or their alloys. Copper is a constituent of CIGS and does not contaminate CIGS. Likewise, aluminum is compatible with the CIGS sputtered material (e.g., aluminum is sometimes used to substitute for a potion of the gallium in CIGS). Since the material of the shield 50 is sputtered and is thus sacrificial, the shield 50 may need to be replaced after a given duration of target usage. Thus, in this embodiment, the floating dark space shield(s) 50 are replaced with a non-floating ring or cylinder shaped sacrificial shield(s) which are in poor thermal contact with the cathode assembly at each end of the assembly and which are passively heated to prevent or reduce selenium condensation. In one embodiment, the shield 50 may be recessed from a target surface to prevent re-deposition of the areas of a low sputtering rate away from the cathode magnetic field.

FIG. 18 illustrates a sputtering tool apparatus 1800. The apparatus 1800 is equipped with an input, or load, module 1821a and a symmetrical output, or unload, module 1821b. Between the input and output modules are process modules 1822a, 1822b, 1822c and 1822d. The number of process modules 1822a, 1822b, 1822c and 1822d may be varied to match the requirements of the device that is being produced. Each module has a pumping device 1823, such as vacuum pump, for example a high throughput turbomolecular pump, which is to provide the required vacuum and to handle the flow of process gases during the sputtering operation. Each module 1822a, 1822b, 1822c and 1822d may have a number of pumps 1823 placed at other locations selected to provide optimum pumping of process gases. The modules 1822a, 1822b, 1822c and 1822d are connected together at slit valves 1824, which contain very narrow low conductance isolation slots to prevent process gases from mixing between modules. These low conductance isolation slots may be separately pumped if required to increase the isolation even further.

Other module connectors 1824 may also be used. Alternatively, a single large chamber may be internally segregated to effectively provide the module regions, if desired. U.S. Pat. No. 7,544,884 to Hollars ("Hollars") entitled "Manufacturing Method for Large Scale Production of Thin-Film Solar Cells," filed on Oct. 25, 2004, discloses a vacuum sputtering apparatus 1800 having connected modules, and is incorporated herein by reference in its entirety. The web substrate 100 is moved throughout the machine by rollers 1828, or other devices. Additional guide rollers may be used. Rollers 1828 shown in FIG. 18 are schematic and non-limiting examples. Some rollers 1828 may be bowed to spread the web, some may move to provide web steering, and some may provide web tension feedback to servo controllers, and others may be mere idlers to run the web in desired positions. The input spool 1831a and optional output spool 1831b thus are actively driven and controlled by feedback signals to keep the web in constant tension throughout the machine. In addition, the input and output modules may each contain a web splicing region or device 1829 where the web 100 can be cut and spliced to a leader or trailer section to facilitate loading and unloading of the roll. In some embodiments, the web 100, instead of being rolled up onto output spool 1831b, may be sliced into solar modules or cells by the web splicing device 1829 in the output module 1821b. In these embodiments, the output spool 1831b may be omitted. As a non-limiting example, some of the devices/steps may be omitted or replaced by any other suitable devices/steps. For example, bowed rollers and/or steering rollers may be omitted in some embodiments. Heater arrays 1830 are operatively connected to the controller 101 and are placed in locations where necessary to provide web heating depending upon process requirements. These heaters 1830 may be a matrix of high temperature quartz lamps laid out across the width of the web. Infrared sensors provide a feedback signal to control the lamp power and provide uniform heating across the web. In one embodiment, as shown in FIG. 18, the heaters 1830 are placed on one side of the web 100 and sputtering targets 27a-e are placed on the other side of the web 100. Sputtering targets 27a-e may be mounted on dual cylindrical rotary magnetron(s), or planar magnetron(s) sputtering sources, or RF sputtering sources.

After being pre-cleaned, the web substrate 100 may first pass by heater array 1830f in module 1821a, which provides at least enough heat to remove surface adsorbed water. Subsequently, the web can pass over roller 1832, which can be a special roller configured as a cylindrical rotary magnetron. This allows the surface of electrically conducting (metallic) webs to be continuously cleaned by DC, AC, or RF sputtering as it passes around the roller/magnetron. The sputtered web material is caught on shield 1833, which is periodically changed. Preferably, another roller/magnetron may be added (not shown) to clean the back surface of the web 100. Direct sputter cleaning of a web 100 will cause the same electrical bias to be present on the web 100 throughout the apparatus 1800, which, depending on the particular process involved, might be undesirable in other sections of the apparatus 1800. The biasing can be avoided by sputter cleaning with linear ion guns instead of magnetrons, or the cleaning could be accomplished in a separate smaller machine prior to loading into this large roll coater. Also, a corona glow discharge treatment could be performed at this position without introducing an electrical bias.

The substrate 100 may be a foil web, for example, a metal web substrate, a polymer web substrate, or a polymer coated metal web substrate, and may be continuously passing through the sputtering module 1822b during the sputtering process, following the direction of the imaginary arrow along the web 100. Any suitable materials may be used for the foil web. For example, metal (e.g., stainless steel, aluminum, or titanium) or thermally stable polymers (e.g., polyimide or the like) may be used. The foil web 100 may move at a constant or variable rate to enhance deposition.

Next, the web 100 passes into the process module 1822a through valve 1824. Following the direction of the imaginary arrows along the web 100, the full stack of layers may be deposited in one continuous process. The first electrode 200 of the solar cell shown in FIG. 19 may be sputtered in the process module 1822a over the web 100, as illustrated in FIG. 18. Optionally, the process module 1822a may include more than one target (e.g., for sputtering barrier and/or adhesion layers).

Optionally, the process module 22a may include more than one target, for example a first alkali-containing transition metal target (e.g., sodium containing molybdenum) target and a second alkali-containing transition metal target (e.g., molybdenum target), arranged in such a way that each alkali-containing transition metal target has a composition different from that of the transition metal target, to form a molybdenum barrier layer(s) over and/or under a sodium containing molybdenum layer.

The web 100 then passes into the next process module, 1822b, for deposition of the at least one p-type semiconductor absorber layer 301. In a preferred embodiment shown in FIG. 18, the step of depositing the at least one p-type semiconductor absorber layer 301 includes reactively alternating current (AC) magnetron sputtering the semiconductor absorber layer from at least one pair of two conductive targets 27c1 and 27c2, in a sputtering atmosphere that comprises argon gas and a selenium-containing gas. In some embodiment, the pair of two conductive targets 27c1 and 27c2 comprise the same targets which are illustrated and described above with respect to one or more of FIGS. 5-17. For example, each of the at least two conductive targets 27c1 and 27c2 comprises copper, indium and gallium, or comprises copper, indium and aluminum. The selenium-containing gas may be hydrogen selenide or selenium vapor. In other embodiments, targets 27c1 and 27c2 may comprise different materials from each other. The radiation heaters 1830 maintain the web at the required process temperature, for example, around 400-800° C., for example around 500-700° C., which is preferable for the CIGS deposition.

The web 100 may then pass into the process modules 1822c and 1822d, for depositing the n-type semiconductor layer 302, and the transparent top electrode 400, respectively. Any suitable type of sputtering sources may be used, for example, rotating AC magnetrons, RF magnetrons, or planar magnetrons. Extra magnetron stations (not shown), or extra process modules (not shown) could be added for sputtering the optional one or more anti-reflection (AR) layers.

Finally, the web 100 passes into output module 1821b, where it is either wound onto the take up spool 1831b, or sliced into solar cells using cutting apparatus 1829. While sputtering was described as the preferred method for depositing all layers onto the substrate, some layers may be deposited by MBE, CVD, evaporation, plating, etc., while, preferably, the CIS based alloy is reactively sputtered.

Preferably, the steps of depositing the first electrode 200, depositing the at least one p-type semiconductor absorber layer 301, depositing the n-type semiconductor layer 302, and depositing the second electrode 400 comprise sputtering in corresponding process modules of a plurality of independently isolated, connected process modules without breaking vacuum, while passing the web substrate 100 from an input module to an output module through the plurality of independently isolated, connected process modules such that the web substrate continuously extends from the input module to the output module while passing through the plurality of the independently isolated, connected process modules as shown in FIG. 18. Each of the process modules may include one or more sputtering targets for sputtering material over the web substrate 100.

Optionally, one or more process modules (not shown) may be added between the process modules 1821a and 1822a to sputter a back side protective layer over the back side of the substrate 100 before the electrode 200 is deposited on the front side of the substrate. U.S. application Ser. No. 12/379,428 titled "Protective Layer for large-scale production of thin-film solar cells" and filed on Feb. 20, 2009, which is hereby incorporated by reference, describes such deposition process. Further, one or more barrier layers 201 may be sputtered over the front side of the substrate 100 in the process module(s) added between the process modules 1821a and 1822a. Similarly, one or more process modules (not shown) may be added between the process modules 1822a and 1822b, to sputter one or more barrier/adhesion layers 203 between the alkali-containing transition metal layer 202 and the CIGS layer 301.

Figure 19:
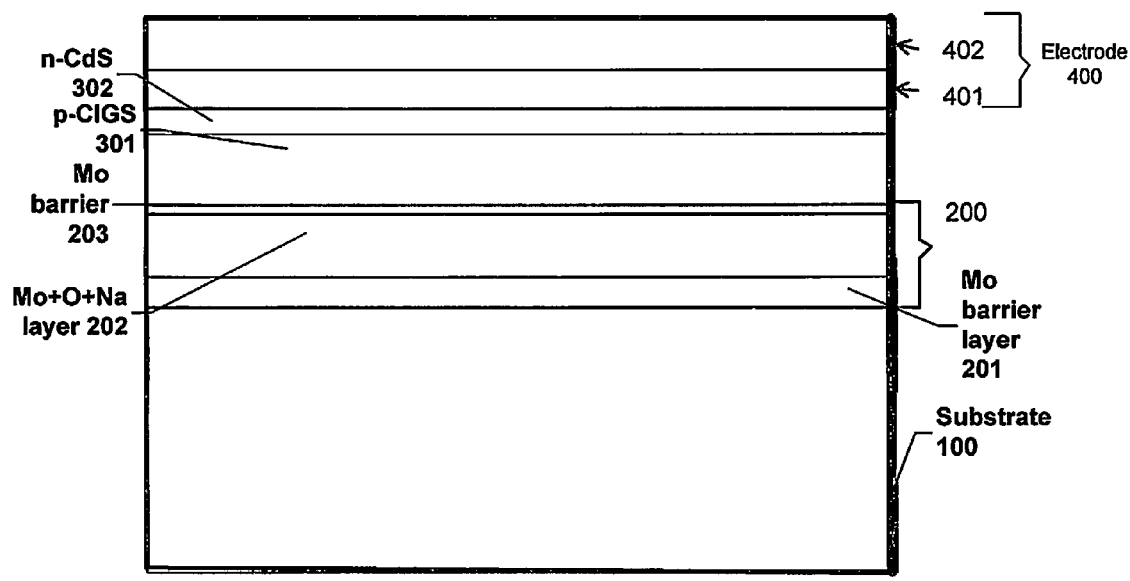
FIG. 19 illustrates a side cross sectional view of a solar cell according to an embodiment of the present disclosure.

FIG. 19 illustrates a solar cell that may be made by embodiments of the methods discussed above. The solar cell contains the substrate 100 and a first (lower) electrode 200. The first electrode 200 may comprise a transition metal, for example, one of Mo, W, Ta, V, Ti, Nb, Zr, or alloys thereof. In one embodiment, the step of depositing the first electrode 200 may comprise DC sputtering a first target 27a comprising a transition metal, such as molybdenum. Optionally, the first electrode 200 of the solar cell may comprise one or more barrier layers 201 located under a alkali-containing transition metal layer 202 (e.g., sodium and oxygen containing molybdenum layer), and/or one or more adhesion/barrier layers 203 located over the alkali-containing transition metal layer 202. In some embodiments, the barrier layer 201 is denser than the adhesion layer 203, and substantially prevents alkali diffusion from the alkali-containing transition metal layer 202 into the substrate 100. In these embodiments, alkali (e.g., Na) may diffuse from the alkali-containing transition metal layer 202, through the lower density adhesion layer 203, into the at least one p-type semiconductor absorber layer 301 during and/or after the step of depositing the at least one p-type semiconductor absorber layer 301. The optional barrier layer 201 and adhesion layer 203 may comprise any suitable materials. For example, they may be independently selected from a group consisting Mo, W, Ta, V, Ti, Nb, Zr, Cr, TiN, ZrN, TaN, VN, $V_2N$ or combinations thereof. In one embodiment, while the barrier layer 201 may be oxygen free, the alkali-containing transition metal layer 202 and/or the adhesion layer 203 may contain oxygen and/or be deposited at a higher pressure than the barrier layer 201 to achieve a lower density than the barrier layer 201.

Alternatively, the optional one or more barrier layers 201 and/or optional one or more adhesion layers 203 may be omitted. When the optional one or more adhesion layers 203 are omitted, the at least one p-type semiconductor absorber layer 301 is deposited over the alkali-containing transition metal layer 202, and alkali may diffuse from the alkali-containing transition metal layer 202 into the at least one p-type semiconductor absorber layer 301 during or after the deposition of the at least one p-type semiconductor absorber layer 301.

A p-type semiconductor absorber layer 301 comprising CIGS(Na) is located over the first electrode 200. Layer 301 may have a stoichiometric composition having a Group I to Group III to Group VI atomic ratio of about 1:1:2, or a non-stoichiometric composition having an atomic ratio of other than about 1:1:2. Preferably, layer 301 is slightly copper deficient and has a slightly less than one copper atom (e.g., 0.8 to 0.99 copper atoms) for each one of Group III atom and each two of Group VI atoms. The step of depositing the at least one p-type semiconductor absorber layer 301 may comprise reactively DC sputtering or reactively AC sputtering the semiconductor absorber layer from at least two electrically conductive targets 27c1, 27c2 in a sputtering atmosphere that comprises argon gas and a selenium containing gas (e.g. selenium vapor or hydrogen selenide as described with respect to FIG. 18). An n-type semiconductor layer 302 may then be deposited over the p-type semiconductor absorber layer 301. The n-type semiconductor layer 302 may comprise any suitable n-type semiconductor "window" materials, for example, but not limited to ZnS, ZnSe or CdS.

A second electrode 400, also referred to as a transparent top electrode, is further deposited over the n-type semiconductor layer 302. The transparent top electrode 400 may comprise multiple transparent conductive layers, for example, but not limited to, one or more of an Indium Tin Oxide (ITO), Zinc Oxide (ZnO) or Aluminum Zinc Oxide (AZO) layers 402 located over an optional resistive Aluminum Zinc Oxide (RAZO) layer 401. Of course, the transparent top electrode 400 may comprise any other suitable materials, for example, doped ZnO or SnO. Optionally, one or more antireflection (AR) films (not shown) may be deposited over the transparent top electrode 400, to optimize the light absorption in the cell, and/or current collection grid lines may be deposited over the top conducting oxide.

Alternatively, the solar cell may be formed in reverse order. In this configuration, a transparent electrode 400 is deposited over a substrate 100, followed by depositing an n-type semiconductor layer 302 over the transparent electrode 400, depositing at least one p-type semiconductor absorber layer 301 over the n-type semiconductor layer 302, and depositing a top electrode 200 comprising an alkali-containing transition metal layer over the at least one p-type semiconductor absorber layer 301. The substrate 100 may be a transparent substrate (e.g., glass) or opaque (e.g., metal). If the substrate 100 used is opaque, then the initial substrate may be delaminated after the steps of depositing the stack of the above described layers, and then bonding a glass or other transparent substrate to the transparent electrode of the stack.

It is to be understood that the present invention is not limited to the embodiment(s) and the example(s) described above and illustrated herein, but encompasses any and all variations falling within the scope of the appended claims. For example, as is apparent from the claims and specification, not all method steps need be performed in the exact order illustrated or claimed, but rather in any order that allows the proper formation of the solar cells of the present invention.

What is claimed is:

1. A sputtering target, comprising:
a cylindrical backing tube having two edges and a sidewall comprising a middle portion located between two end portions;
a copper indium gallium sputtering material contacting the middle portion of the sidewall of the backing tube, wherein the sputtering material does not cover at least one end portion of the sidewall of the backing tube; and
a thermally insulating feature in contact with the at least one end portion of the sidewall of the backing tube, which prevents or reduces a chalcogen buildup and arcing at the at least one end portion of the backing tube not covered by the sputtering material, the thermally insulating feature comprising a dielectric material portion that has a different composition from the copper indium gallium sputtering material, wherein the chalcogen comprises selenium, sulfur or a combination thereof.

2. The sputtering target of claim 1, wherein the sputtering target is incorporated into a sputtering apparatus that includes:
a chamber for containing the sputtering target;
a sputtering source that comprises a magnetron configured to be located inside the backing tube; and
a chalcogen source which provides the chalcogen in the chamber.

3. The sputtering target of claim 1, wherein the backing tube comprises steel.

4. The sputtering target of claim 1, wherein the sputtering material includes chalcogen.

5. The sputtering target of claim 1, wherein the thermally insulating feature comprises a dielectric coating on the at least one end portion of the backing tube.

6. The sputtering target of claim 5, wherein the sputtering target is located in a reactive sputtering chamber having a chalcogen source, and the dielectric coating prevents chalcogen from contacting the at least one end portion of the backing tube.

7. The sputtering target of claim 6, wherein the dielectric coating comprises a polymer, a glass, a ceramic, or a crystalline electrical non-conductor.

8. The sputtering target of claim 6, wherein:
the dielectric coating is applied as a tape on the end portion of the backing tube; or
the dielectric coating is applied via an adhesive on end portion of the backing tube; or
the dielectric coating comprises at least a portion of a sleeve which is disposed on the end portion of the backing tube; or
the dielectric coating is formed as a thin film on the end portion of the backing tube.

9. The sputtering target of claim 6, wherein the dielectric coating comprises a thin film formed by at least one of physical vapor deposition, chemical vapor deposition, oxidation of the backing tube, and anodization of the backing tube.

10. The sputtering target of claim 1, further comprising a heated shield adjacent to the thermally insulating feature and the at least one end portion of the backing tube.

11. The sputtering target of claim 10, wherein the shield is spaced from the thermally insulating feature and the end portion of the backing tube and extends adjacent to an edge of the sputtering material.

12. The sputtering target of claim 11, wherein the shield comprises a stationary shield or a rotating shield.

13. The sputtering target of claim 12, wherein a stationary heater is located adjacent to the rotating shield.

14. The sputtering target of claim 11, wherein an embedded heater is located in the shield, a heater is attached to the shield, or the shield is made of a resistance heater material.

15. The sputtering target of claim 14, wherein the shield is a rotating shield and the heater comprises a rotary electrical connection.

16. The sputtering target of claim 1, further comprising: a heater or a heat lamp directed at the thermally insulating feature and the end portion of the backing tube.

17. The sputtering target of claim 1, further comprising: a heater located adjacent to the thermally insulating feature and the end portion of the backing tube, and wherein the heater is configured to rotate with the backing tube.

18. The sputtering target of claim 1, wherein the thermally insulating feature comprises a thermally insulating material layer inside the backing tube at the end portion of the backing tube but not at the middle portion of the backing tube.

19. The sputtering target of claim 18, wherein the thermally insulating material comprises a tape, a thin film, or an epoxy layer which reduces effect of cooling water inside the backing tube on the end portion of the backing tube.

20. The sputtering target of claim 1, wherein the thermally insulating feature comprises a thermally insulating material located between an end portion of the sputtering material and the backing tube.

21. The sputtering target of claim 1, further comprising a ring shaped shield having poor thermal contact to the sputtering material or to the end portion of the backing tube, wherein the shield covers the thermally insulating feature and the end portion of the backing tube.

22. The sputtering target of claim 21, wherein the shield sets off a dark space at the end portion of the backing tube.

23. The sputtering target of claim 22, wherein the shield comprises an aluminum ring or a copper ring and the sputtering material comprises a copper indium gallium sputtering material.

* * * * *